(12) United States Patent
Asao

(10) Patent No.: US 9,368,553 B2
(45) Date of Patent: Jun. 14, 2016

(54) MEMORY DEVICE

(71) Applicant: Kabushiki Kaisha Toshiba, Minato-ku (JP)

(72) Inventor: Yoshiaki Asao, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/624,920

(22) Filed: Feb. 18, 2015

(65) Prior Publication Data

US 2016/0093674 A1 Mar. 31, 2016

(30) Foreign Application Priority Data

Sep. 30, 2014 (JP) ................................ 2014-202637

(51) Int. Cl.

| H01L 27/24 | (2006.01) |
|---|---|
| G11C 13/00 | (2006.01) |
| H01L 23/528 | (2006.01) |
| H01L 45/00 | (2006.01) |

(52) U.S. Cl.

CPC .......... *H01L 27/2463* (2013.01); *G11C 13/004* (2013.01); *G11C 13/0069* (2013.01); *H01L 23/528* (2013.01); *H01L 27/2436* (2013.01); *H01L 45/1233* (2013.01); *G11C 2013/005* (2013.01); *G11C 2013/0071* (2013.01)

(58) Field of Classification Search

CPC .......................... H01L 27/2463; G11C 13/004
USPC ........................................................ 365/148
See application file for complete search history.

(56) References Cited

U.S. PATENT DOCUMENTS

| 7,248,494 B2 * | 7/2007 | Oh ........................... G11C 7/12 365/148 |
| 7,990,752 B2 * | 8/2011 | Asao ....................... G11C 5/063 365/148 |
| 8,513,751 B2 | 8/2013 | Asao |
| 8,711,602 B2 | 4/2014 | Watanabe et al. |
| 2007/0045712 A1 | 3/2007 | Haller et al. |
| 2014/0063891 A1 | 3/2014 | Asao |

FOREIGN PATENT DOCUMENTS

JP 2013-55134 3/2013

OTHER PUBLICATIONS

Richard Fackenthal, et al., "A 16Gb ReRAM with 200MB/s Write and 1GB/s Read in 27nm Technology", IEEE International Solid-State Circuits Conference, Digest of Technical Papers, 19.7, Session 19, 2014, pp. 338-340.

* cited by examiner

*Primary Examiner* — Hoai V Ho
*Assistant Examiner* — Tri Hoang
(74) *Attorney, Agent, or Firm* — Oblon, McClelland, Maier & Neustadt, L.L.P.

(57) ABSTRACT

According to one embodiment, a memory device includes a first active area, formed on the substrate, which extends in a third direction. The memory device also includes three gate electrodes, provided on the first active area, which extend in a second direction intersecting the third direction. The memory device also includes at least two or more upper-layer interconnects and at least two or more lower-layer interconnects, provided on the first active area, which extend in a first direction intersecting the second direction and the third direction. The memory device also includes first transistors of three, each of them is provided at the intersection point between the first active area and the three gate electrodes. The memory device also includes the first transistors of three are one device isolation transistor and two cell transistors.

14 Claims, 18 Drawing Sheets

MEMORY DEVICE

CROSS-REFERENCE TO RELATED APPLICATIONS

This application is based upon and claims the benefit of priority from Japanese Patent Application No. 2014-202637, filed on Sep. 30, 2014; the entire contents of which are incorporated herein by reference.

FIELD

Embodiments described herein relate generally to a memory device.

BACKGROUND

As resistance change type memories, various memories such as a superlattice-type phase change memory, a phase change memory, and an ion memory have been proposed and developed. The principles of the respective memory operations thereof are different from each other in the use of filament formation due to a phase change in superlattice, a change in crystal state, ion conduction, or the like. However, any of the memories is common in that the resistance of the memory device transitions to a high resistance state and a low resistance state due to the application of a voltage or a current. In these memory devices, a reduction in manufacturing cost is also required.

DETAILED DESCRIPTION

According to one embodiment, a memory device includes a substrate. The memory device also includes a first active area, formed on the substrate, which extends in a third direction. The memory device also includes three gate electrodes, provided on the first active area, which extend in a second direction intersecting the third direction. The memory device also includes at least two or more upper-layer interconnects and at least two or more lower-layer interconnects, provided on the first active area, which extend in a first direction intersecting the second direction and the third direction. The memory device also includes first transistors of three, each of them is provided at the intersection point between the first active area and the three gate electrodes. The memory device also includes the first transistors of three are one device isolation transistor and two cell transistors, the lower-layer interconnects being connected to the first active area through a first contact, the upper-layer interconnects being connected to the first active area through a resistance change device and a second contact, and the gate electrode is provided between the first contact and the second contact.

Hereinafter, embodiments of the invention will be described with reference to the accompanying drawings.

Meanwhile, in the following description, the semiconductor substrate side is represented as a lower side for the sake of convenience. In addition, in the specification, intersection is used in the meaning that two lines cross each other.

First Embodiment

Figure 1:
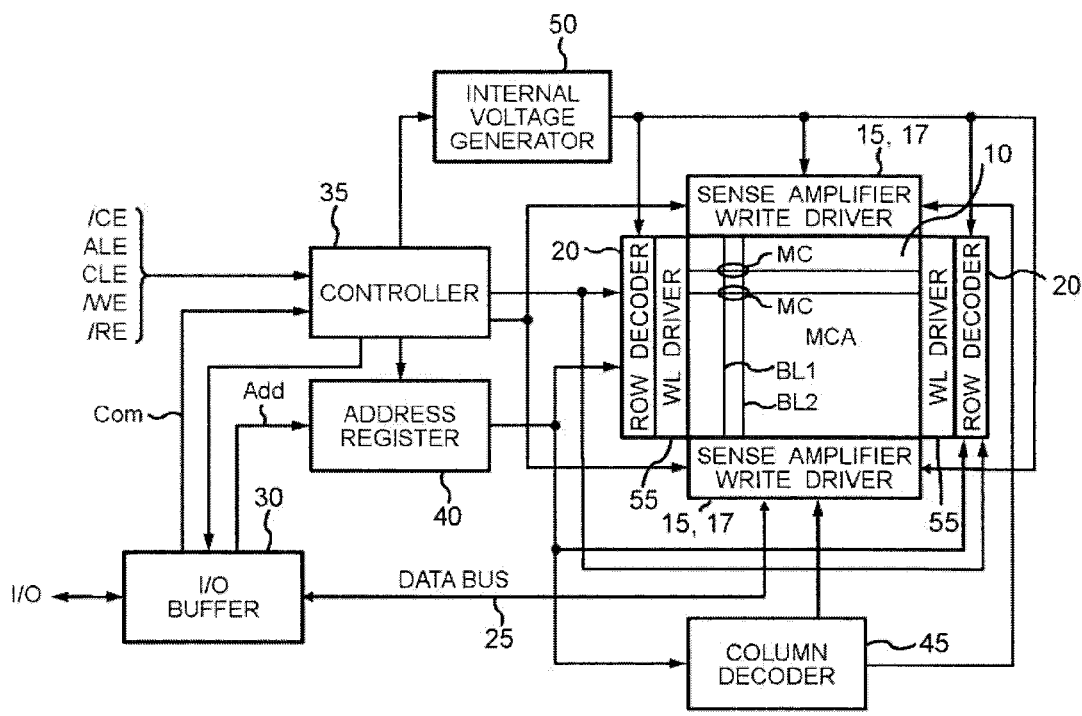
FIG. 1 is a block diagram illustrating a configuration of a resistance change type memory according to a first embodiment.
Figure 2:
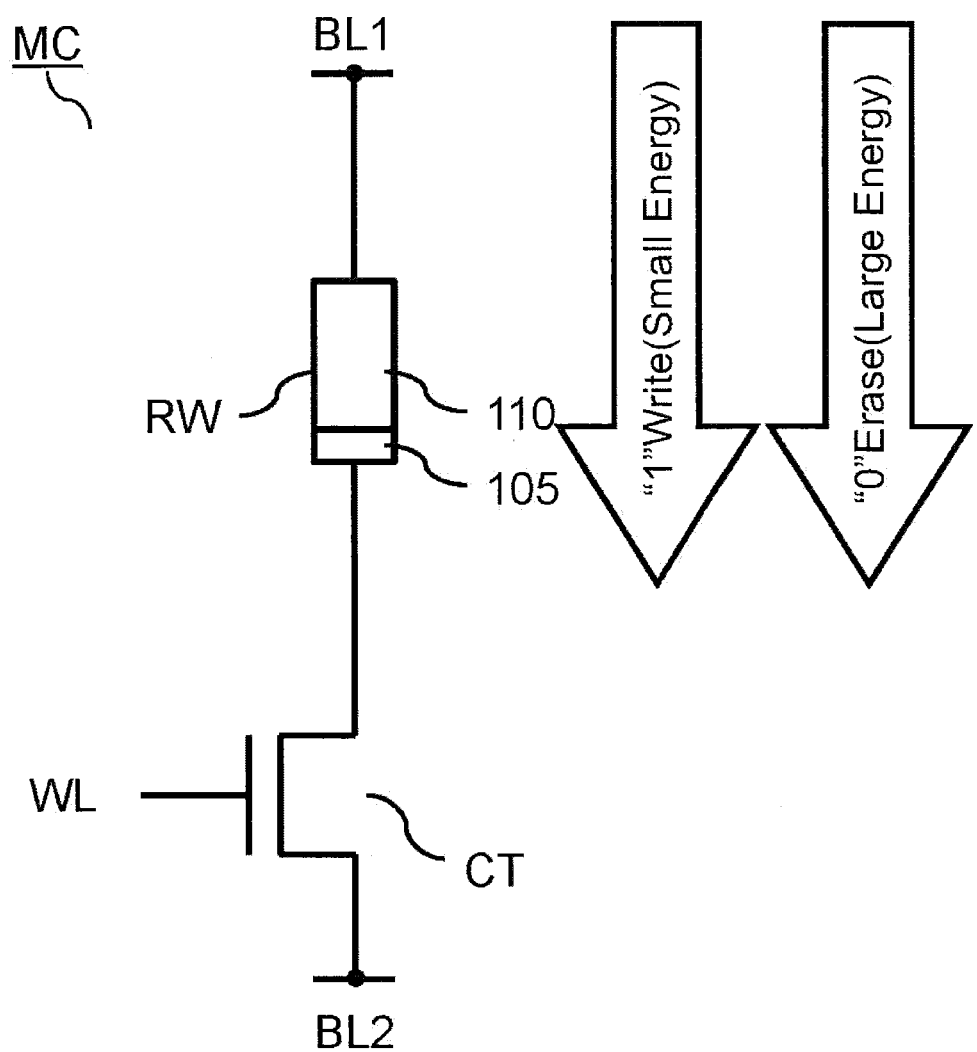
FIG. 2 is a diagram illustrating a structure and an operation of the memory cell MC in the first embodiment.

FIG. 1 is a block diagram illustrating a configuration of a resistance change type memory according to a first embodiment. A plurality of memory cells MC are disposed in a matrix within a memory cell array 10. As shown in FIG. 2, each of the memory cells MC includes a resistance change device RW and a cell transistor CT. The resistance change device RW is a device that stores data on the basis of a change in resistance state, and is capable of rewriting data using a
} current. The cell transistor CT is provided corresponding to the resistance change device RW. When the cell transistor CT is set to be in an electrical conduction state, a current flows to the corresponding resistance change device RW.

A plurality of word lines WL and a plurality of bit lines BL are wired within the memory cell array 10 so as to intersect each other in a row direction (first direction) and a column direction (second direction), respectively. Two bit lines BL next to each other form a pair. The memory cell MC is provided corresponding to the intersection point between the word line WL and a bit line pair (pair of a first bit line BL1 and a second bit line BL2). The resistance change device RW and the cell transistor CT of each memory cell MC are connected in series to each other. The resistance change device RW is connected to one bit line of the bit line pair (for example, BL1 and BL2), and the cell transistor CT is connected to the other bit line of the bit line pair. In addition, the gate electrode of the cell transistor CT is connected to the word line WL.

A sense amplifier 15 and a write driver 17 are disposed on both sides of the memory cell array 10 in a bit line direction. The sense amplifier 15 is connected to the bit line BL, and reads out data which is stored in the memory cell MC by detecting a current flowing to the memory cell MC which is connected to a selection word line WL. The write driver 17 is connected to the bit line BL, and writes data by causing a current to flow to the memory cell MC which is connected to the selection word line WL.

A row decoder 20 and a word line driver 55 are respectively disposed on both sides of the memory cell array 10 in a word line direction. The word line driver 55 is connected to the word line WL, and applies a voltage to the selection word line WL during data readout or data writing.

Data delivery between the sense amplifier 15 or the write driver 17 and an external input and output terminal I/O is performed through a data bus 25 and an I/O buffer 30.

Various types of external control signals, for example, a chip enable signal /CE, an address latch enable signal /WE, a command latch enable signal CLE, a writing enable signal /WE, a readout enable signal /RE, and the like are input to a controller 35. The controller 35 identifies an address signal Add and a command signal Com which are supplied from the external input and output terminal I/O, on the basis of these control signals. The controller 35 transfers the address signal Add to the row decoder 20 and a column decoder 45 through an address register 40. In addition, the controller 35 decodes the command signal Com. The sense amplifier 15 applies a voltage to the bit line BL in accordance with a column address which is decoded by the column decoder 45. The word line driver 55 applies a voltage to the word line WL in accordance with a row address which is decoded by the row decoder 20.

The controller 35 performs each sequence control of data readout and data writing and erasure in accordance with the address signal Add and the command signal Com. An internal voltage generation circuit 50 generates an internal voltage (for example, voltage obtained by boosting a power supply voltage which is supplied from the outside of the resistance change type memory) which is required for each operation. The internal voltage generation circuit 50 is also controlled by the controller 35, and performs a boost operation to generate a required voltage.

FIG. 2 is a diagram illustrating a structure and an operation of the memory cell MC in the embodiment. In the embodiment, the resistance change device RW of the memory cell MC is connected to the first bit line BL1 side and the cell transistor CT, and the cell transistor CT is connected to the resistance change device RW and the second bit line BL2.

As an example of the resistance change device RW, a superlattice-type phase change memory device is shown in FIG. 2.

The superlattice-type phase change memory device has the crystal structure of a superlattice changed by adding electrical energy, and is able to take a low resistance state and a high resistance state. Here, when the low resistance state is defined as data "1", and the high resistance state is defined as data "0", 1-bit data can be stored in the superlattice-type phase change memory device. Naturally, the low resistance state may be defined as "0", and the high resistance state may be defined as "1".

For example, as shown in FIG. 2, the superlattice-type phase change memory device includes, for example, an orientation layer 105 and a superlattice layer 110 using a first crystal layer and a second crystal layer. In addition, the superlattice-type phase change memory device includes an electrode layer (not shown), as necessary.

The orientation layer 105 enhances characteristics by improving the orientation of the superlattice layer 110. For example, a material having a hexagonal crystal structure is used in the layer. Specifically, a chalcogen compound containing antimony and tellurium as a major component or a chalcogen compound containing bismuth and tellurium as a major component is used in the layer.

The superlattice layer 110 has the first crystal layer and the second crystal layer stacked alternately repeatedly.

The first crystal layer is configured such that the positions of constituent atoms transition reversibly by applying an electrical pulse, and a chalcogen compound containing, for example, germanium and tellurium as a major component is used in the layer.

The second crystal layer is a layer for supplementing the atomic transition of the first crystal layer, and is not necessarily required for the crystal structure of the second crystal layer to transition, but may have the crystal structure transitioning. For example, a chalcogen compound containing antimony as a major component, a chalcogen compound containing bismuth and tellurium as a major component, or the like is used in the second crystal layer.

The superlattice-type phase change memory device performs a writing operation (transition from data "0" to "1") and an erasure operation (transition from data "1" to "0"), for example, by adding electrical energy. Here, the electrical energy means integration regarding the time of power.

In the superlattice phase change memory device, the erasure operation requires high electrical energy rather than the writing operation. Thus, a method of making an applied voltage during erasure higher than an applied voltage during writing, or a method of making an application time during erasure longer than an application time during writing is used.

Figure 3:
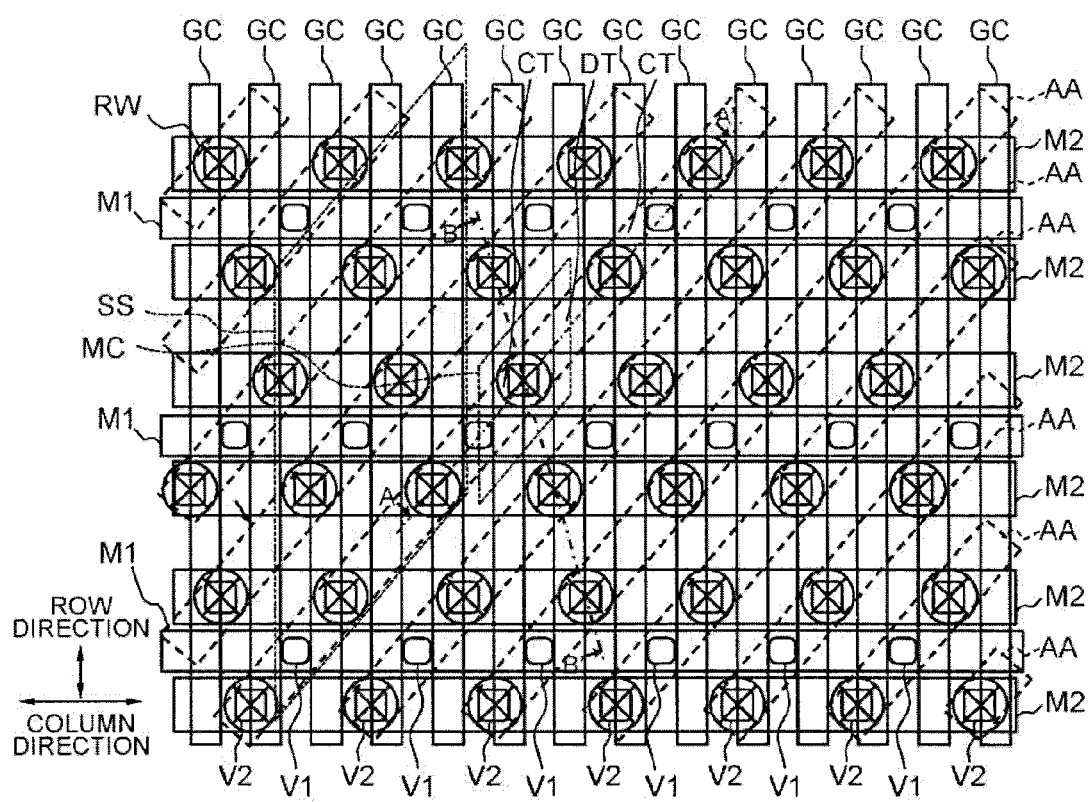
FIG. 3 is a planar layout diagram illustrating the resistance change type memory according to the first embodiment.
Figure 4A:
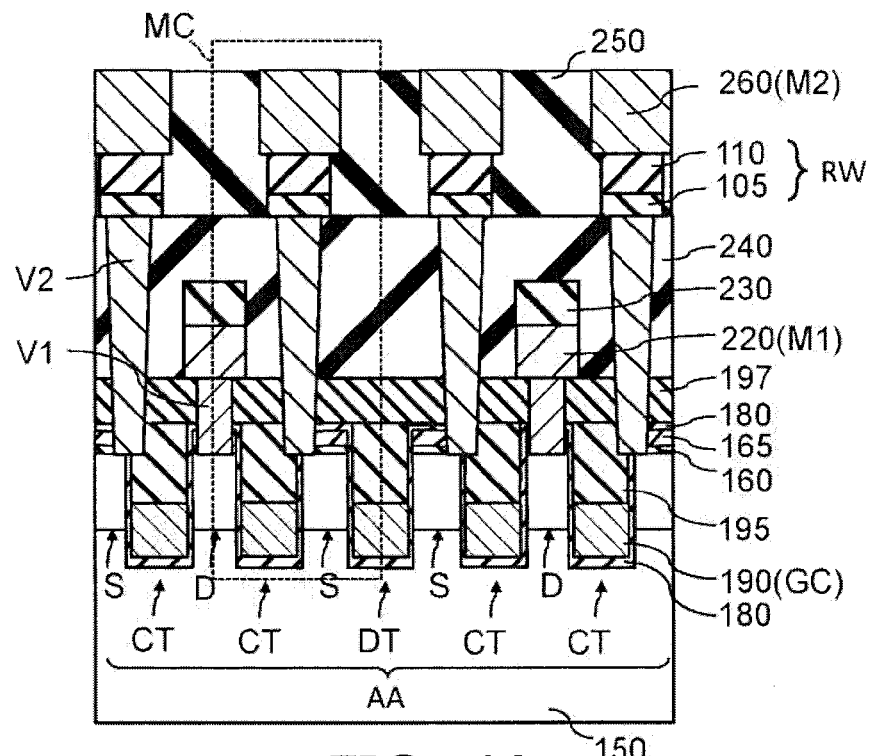
FIG. 4A is a cross-sectional view taken along line A-A of FIG. 3.
Figure 4B:
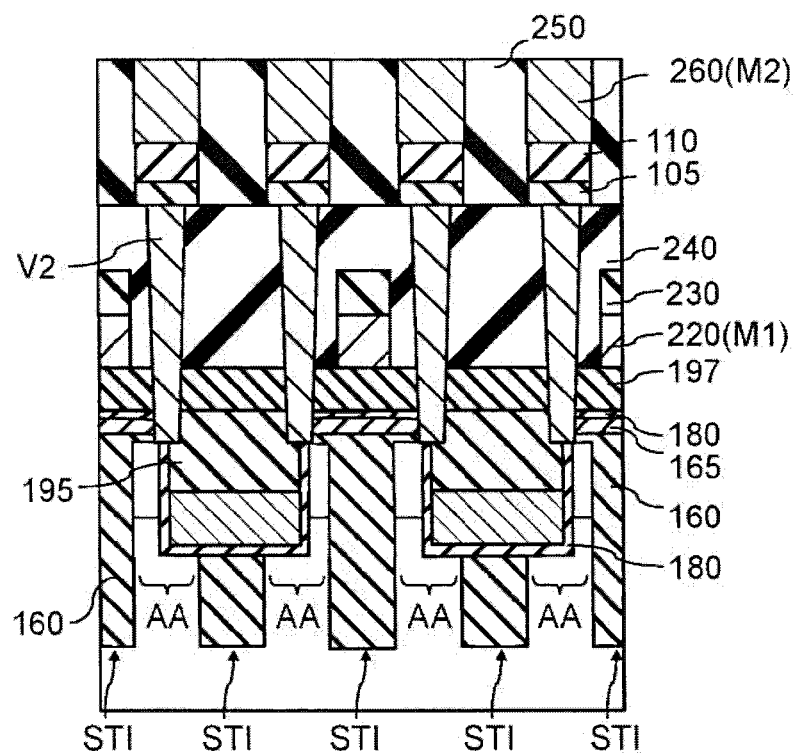
FIG. 4B is a cross-sectional view taken along line B-B' of FIG. 3.

FIG. 3 is a planar layout diagram illustrating the resistance change type memory according to the first embodiment. FIG. 4A is a cross-sectional view taken along line A-A of FIG. 3. FIGS. 4A and 4B are cross-sectional views taken along line B-B of FIG. 3.

In the following description, the extending direction of a gate electrode GC is called a row direction (first direction). In addition, the extending direction of a lower interconnect layer M1 and an upper interconnect layer M2, which is approximately orthogonal to the first direction, is called a column direction (second direction).

An active area AA is formed to have an angle with respect to both the row direction and the column direction.

First, the cross-sectional views of the embodiment will be described with reference to FIG. 4A and FIG. 4B. FIG. 4A is a cross-sectional view when the cross-section of the active area AA in the extending direction is viewed from an orthogonal direction.

As shown in FIG. 4A, a plurality of cell transistors CT and dummy transistors DT are provided in the active area AA.

The dummy transistor DT and the cell transistor CT are provided on both sides of the cell transistor CT. The cell transistors CT are provided on both sides of the dummy transistor DT. That is, in the main portion of the resistance change type memory, three transistors of the cell transistor CT, the cell transistor CT, and the dummy transistor DT are periodically provided in the direction of the active area AA. Meanwhile, in the end of the active area AA, the dummy transistor DT may be continuously disposed.

The cell transistor CT includes the gate electrode GC and a gate insulating film 180 which are buried in a semiconductor substrate 150. An N+-type source region S and a drain region D are provided on both sides of the gate electrode GC of the cell transistor CT. The cell transistor CT is driven, thereby allowing access to the resistance change device RW to be achieved.

The dummy transistor DT includes the gate electrode GC and the gate insulating film 180 which are buried in the semiconductor substrate 150. The N+-type source region S of the cell transistor CT is provided on both sides of the gate electrode GC of the dummy transistor DT.

The drain region D of the cell transistor CT is electrically connected to the lower interconnect layer M1 through a lower interconnect layer contact V1. The lower interconnect layer M1 functions as the second bit line BL2.

The source region S of the cell transistor CT is electrically connected to the lower side portion of the resistance change device RW through an upper interconnect layer contact V2.

The resistance change device RW includes the orientation layer 105 and the superlattice layer 110. The superlattice layer 110 is electrically connected to the upper interconnect layer M2 thereabove. The upper interconnect layer M2 functions as the first bit line BL1. The resistance change device RW stores 1-bit data.

The relation of connection in FIG. 4A, described above, with respect to the memory cell MC is summarized as follows.

The lower interconnect layer M1 functioning as the second bit line BL2 is electrically connected to the drain region D of the cell transistor CT through the lower interconnect layer contact V1. The source region S of the cell transistor CT is connected to the resistance change device RW through the upper interconnect layer contact V2. The resistance change device RW is connected to the upper interconnect layer M2 functioning as the first bit line BL1.

FIG. 4B is a cross-sectional view taken along line B-B' of FIG. 3. The active area AA and a device isolation region STI (Shallow Trench Isolation) are formed in the semiconductor substrate 150.

The planar layout of the embodiment will be described with reference to FIG. 3. Meanwhile, FIG. 3 shows a portion of the memory cell array. The active area AA, the gate electrode GC, the upper interconnect layer M2, the lower interconnect layer M1, and the like can also be extended to the outside of FIG. 3.

Each gate electrode GC is formed extending in the row direction, spaced at a predetermined interval in the column direction. In addition, the lower interconnect layer M1 and the upper interconnect layer M2 are formed extending in the column direction perpendicular to the row direction. Each active area AA is formed extending so as to have an angle in both the row direction and the column direction, spaced at a predetermined interval.

The cell transistor CT or the dummy transistor DT is formed at the intersection point between each gate electrode GC and each active area AA.

Meanwhile, when focused on one gate electrode GC, in the main portion of the memory cell array, the dummy transistor DT, the cell transistor CT, and the cell transistor CT are repeatedly provided in this order. Meanwhile, the dummy transistor DT may be continuously disposed in the end of the gate electrode GC (not shown).

The lower interconnect layer contact V1 is formed at the intersection point between the lower interconnect layer M1 and each active area AA. The lower interconnect layer contact V1 is electrically connected to the lower interconnect layer M1 at the upper side portion, and is electrically connected to the drain region D of the active area AA at the lower side portion. The drain region D to which the lower interconnect layer contact V1 is connected has the cell transistor CT formed on both sides of the region thereof.

The upper interconnect layer contact V2 and the resistance change device RW are formed at the intersection point between the upper interconnect layer M2 and the active area AA. The upper interconnect layer M2 is electrically connected to the resistance change device RW. The resistance change device RW is electrically connected to the upper interconnect layer contact V2 at the lower side portion. The upper interconnect layer contact V2 is electrically connected to the source region S of the active area AA at the lower side portion.

The source region S to which the upper interconnect layer contact V2 is connected has the cell transistor CT and the dummy transistor DT formed on both sides of the region thereof.

The relation of connection regarding the memory cell MC shown in FIG. 3 has been described in FIG. 4A, and thus the description thereof will not be given.

Meanwhile, the memory cell MC of the resistance change device RW according to the embodiment has a size of 6F2 (3F×2F) which is very small. Here, F is a minimum processing size using a lithography technique and an etching technique.

Next, reference will be made to FIG. 5 to describe the relationship between the half pitch $F_{M2}$ (half of the sum of the width of the upper interconnect layer and the space between the upper interconnect layers) of the upper interconnect layer M2 and the half pitch $F_C$ (half of the sum of the width of a gate electrode wire and the space between the gate electrode wires) of a gate electrode wire, and the angle of the active area AA. In the embodiment, the relation of $F_{M2}$=appropriately 1.77$F_{GC}$ is established in $F_{M2}$ and $F_{GC}$, and the active area AA extends in a direction inclined at approximately 40.2 degrees with respect to the row direction which is the extending direction of the gate electrode GC. The reason will be described below.

Figure 5:
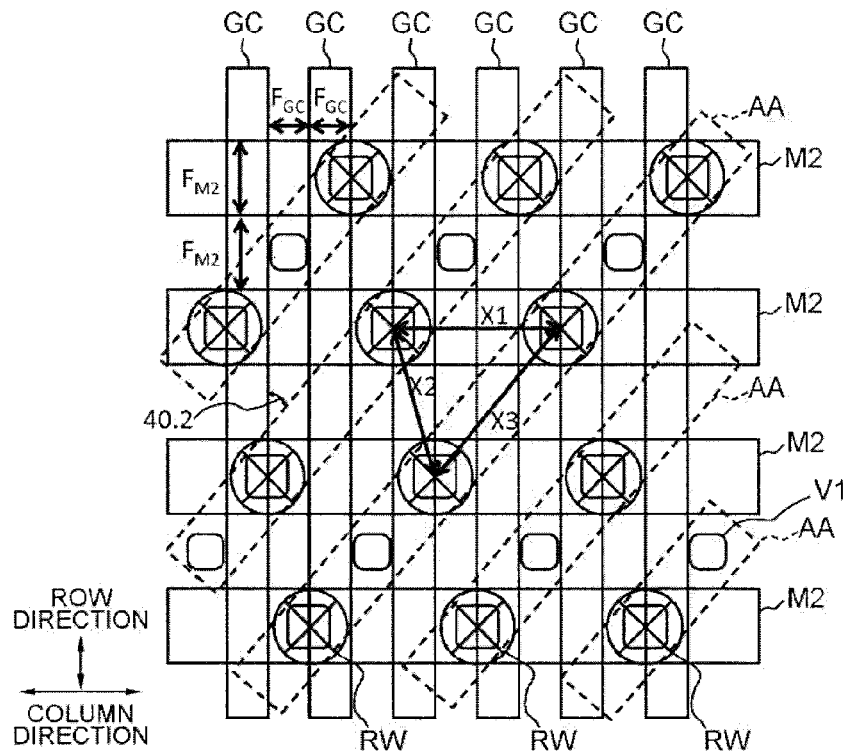
FIG. 5 is a diagram illustrating a upper-layer interconnects and a half pitch of a gate electrode and an angle between an active area and the gate electrode of the resistance change type memory according to the first embodiment.

FIG. 5 is an enlarged view illustrating a portion of FIG. 3. The lower interconnect layer M1 is not shown in the drawing for the purpose of viewability.

Here, a distance between the resistance change devices RW next to each other is considered. Regarding the distance, three kinds of distances are examined from the viewpoint of symmetry. The first distance is a distance X1 between the resistance change devices RW which are connected to the same upper interconnect layer M2. The second distance is a distance X2 between the resistance change devices RW which are connected to the upper interconnect layers M2 next to each other and are shifted by $F_{GC}$ in the column direction. The third distance is a distance X3 between the resistance change devices RW which are connected to the upper interconnect layers M2 next to each other and are shifted by $3F_{GC}$ in the column direction.

The respective distances are represented as follows using $F_{GC}$ and $F_{M2}$.

$$X1 = 4F_{GC}$$
$$X2 = \sqrt{F_{GC}^2 + 4F_{M2}^2}$$
$$X3 = \sqrt{F_{GC}^2 + 9F_{M2}^2}$$ [Expression 1]

The minimization of differences between mutual distances of X1, X2 and X3 is a case where the sum of squares of differences between the respective distances becomes minimum. This is obtained as the relation of $F_{M2}$=appropriately $1.77F_{GC}$.

The angle between the active area AA and the gate electrode GC is represented by 90-a tan ($2F_{GC}/3F_{M2}$). Therefore, the active area AA is formed in a direction inclined at approximately 40.2 degrees with respect to the row direction which is the extending direction of the gate electrode GC.

According to the embodiment, in this planar layout, the resistance change devices RW are disposed so that the distances therebetween are most equal to each other. This can facilitate the formation of a mask pattern and an etching process, in the process of the resistance change device RW. This is a very important effect in a semiconductor memory device requiring a reduction in size.

As described above, in the embodiment, three distances are not able to be made to be equal to each other, but two distances are able to be made to be equal to each other. In this case, the half pitch $F_{M2}$ of the upper interconnect layer M2 and the half pitch Fac of the gate electrode wire may be set as follows.

For example, when X1 and X2 are formed to be equal to each other, the relation of $F_{M2}$=appropriately $1.93F_{GC}$ may be preferably established in $F_{M2}$ and $F_{GC}$. Meanwhile, the active area AA is formed so as to be inclined at approximately 37.7 degrees with respect to the row direction. Such a layout in which X1 and X2 are formed to be equal to each other is useful in a case where, for example, the processing margin of a thinner gate electrode GC is sufficient, and it is possible to further reduce the half pitch of the gate electrode GC.

In addition, for example, when X1 and X3 are formed to be equal to each other, the relation of $F_{M2}$=appropriately $1.32F_{GC}$ may be preferably established in $F_{M2}$ and $F_{GC}$. Meanwhile, the active area AA is inclined at approximately 48.6 degrees with respect to the row direction. Such a layout in which X1 and X3 are formed to be equal to each other is useful in a case where the processing margin of AA or M2 is sufficient, and it is possible to further reduce the half pitch of AA or M2.

Meanwhile, X2 and X3 does not become equal to each other.

Figure 6:
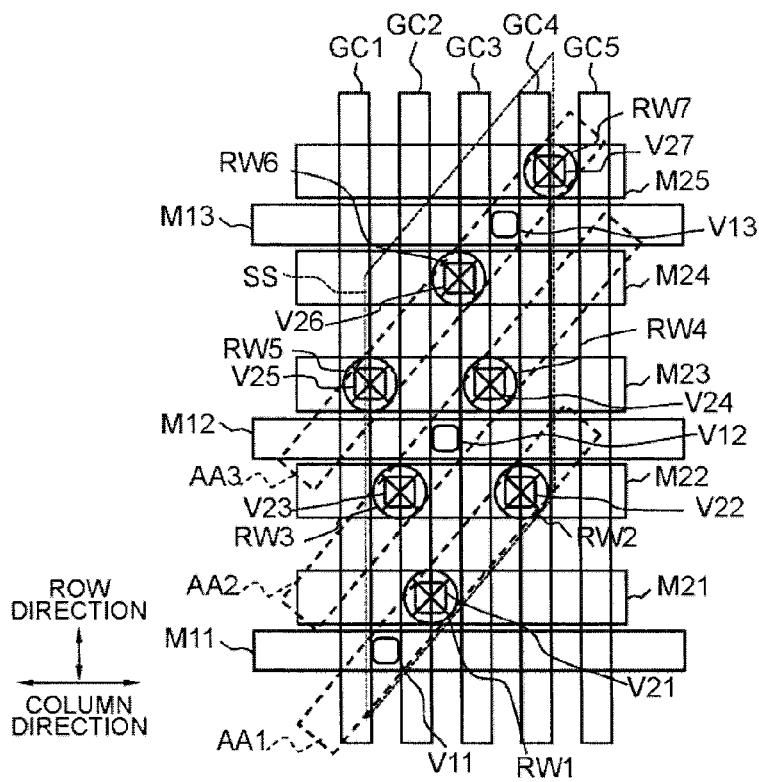
FIG. 6 is an enlarged diagram illustrating an example of a repeating unit of the resistance change type memory according to the first embodiment.

Next, the planar layout of FIG. 3 will be described in detail using a region SS which is an example of a repeating unit as a specific example. FIG. 6 shows a planar layout obtained by extracting the region SS. Meanwhile, in FIG. 6, a contact or the like in a region which is not included in the region SS is not shown for the purpose of viewability.

As shown in FIG. 6, a first gate electrode GC1, a second gate electrode GC2, a third gate electrode GC3, a fourth gate electrode GC4, and a fifth gate electrode GC5 are formed in the row direction. In addition, a first active area AA1, a second active area AA2, and a third active area AA3 are formed in a direction having an angle in the row direction and the column direction.

In addition, a first lower interconnect layer M11, a second lower interconnect layer M12, and a third lower interconnect layer M13 which extend in the column direction are formed in the region SS. In addition, at least a first upper interconnect layer M21, a second upper interconnect layer M22, a third upper interconnect layer M23, a fourth upper interconnect layer M24, and a fifth upper interconnect layer M25 which extend in the column direction are formed.

Above the first active area AA1, a first lower interconnect layer contact V11 is provided between the first gate electrode GC1 and the second gate electrode GC2, a first upper interconnect layer contact V21 is provided between the second gate electrode GC2 and the third gate electrode GC3, and a second upper interconnect layer contact V22 is provided between the third gate electrode GC3 and the fourth gate electrode GC4.

The first lower interconnect layer contact V11 is electrically connected to the first lower interconnect layer M11. The first upper interconnect layer contact V21 is electrically connected to a first resistance change device RW1 at the upper side portion. The first resistance change device RW1 is electrically connected to the first upper interconnect layer M21 at the upper end. The second upper interconnect layer contact V22 is electrically connected to a second resistance change device RW2 at the upper side portion. The second resistance change device RW2 is electrically connected to the second upper interconnect layer M22 at the upper end.

Above the second active area AA2, a third upper interconnect layer contact V23 is provided between the first gate electrode GC1 and the second gate electrode GC2, a second lower interconnect layer contact V12 is provided between the second gate electrode GC2 and the third gate electrode GC3, and a fourth upper interconnect layer contact V24 is provided between the third gate electrode GC3 and the fourth gate electrode GC4.

The second lower interconnect layer contact V12 is electrically connected to the second lower interconnect layer M12. The third upper interconnect layer contact V23 is electrically connected to a third resistance change device RW3 at the upper side portion. The third resistance change device RW3 is electrically connected to the second upper interconnect layer M22 at the upper end. The fourth upper interconnect layer contact V24 is electrically connected to a fourth resistance change device RW4 at the upper side portion. The fourth resistance change device RW4 is electrically connected to the third upper interconnect layer M23 at the upper end.

Above the third active area AA3, a fifth upper interconnect layer contact V25 is provided between the first gate electrode GC1 and the second gate electrode GC2, a sixth upper interconnect layer contact V26 is provided between the second gate electrode GC2 and the third gate electrode GC3, a third lower interconnect layer contact V13 is provided between the third gate electrode GC3 and the fourth gate electrode GC4, and a seventh upper interconnect layer contact V27 is provided between the fourth gate electrode and the fifth gate electrode.

The third lower interconnect layer contact V13 is electrically connected to the third lower interconnect layer M13. The fifth upper interconnect layer contact V25 is electrically connected to a fifth resistance change device RW5 at the upper side portion. The fifth resistance change device RW5 is electrically connected to the third upper interconnect layer M23 at the upper end. The sixth upper interconnect layer contact V26 is electrically connected to a sixth resistance change device RW6 at the upper side portion. The sixth resistance change device RW6 is electrically connected to the fourth upper interconnect layer M24 at the upper end. The seventh upper interconnect layer contact V27 is electrically connected to a seventh resistance change device RW7 at the upper side portion. The seventh resistance change device RW7 is electrically connected to the fifth upper interconnect layer M25 at the upper end.

Meanwhile, transistors which are formed at the intersection points between the first active area AA1, and the first gate electrode GC1, the second gate electrode GC2, the fourth gate electrode GC4, and the fifth gate electrode GC5 are the cell transistors CT. A transistor which is formed at the intersection point between the first active area AA1 and the third gate electrode GC3 is the dummy transistor DT.

Similarly, transistors which are formed at the intersection points between the second active area AA2, and the second gate electrode GC2, the third gate electrode GC3, and the fifth gate electrode GC5 are the cell transistors CT. Transistors which are formed at the intersection points between the second active area AA2, and the first gate electrode GC1 and the fourth gate electrode GC4 are the dummy transistors DT.

Similarly, transistors which are formed at the intersection points between the third active area AA3, and the first gate electrode GC1, the third gate electrode GC3, and the fourth gate electrode GC4 are the cell transistors CT. Transistors which are formed at the intersection points between the third active area AA3, and the second gate electrode GC2 and the fifth gate electrode GC5 are the dummy transistors DT.

The first resistance change device RW1 which is connected to the first active area AA1 and the first upper interconnect layer M21, and the third resistance change device RW3 which is connected to the second active area AA2 and the second upper interconnect layer M22 are preferably formed so as to be shifted in the column direction by a distance of the half pitch $F_{GC}$ of the gate electrode. In addition, the third resistance change device RW3 and the fifth resistance change device RW5 which is connected to the third active area AA3 and the third upper interconnect layer M23 are also preferably formed so as to be shifted in the column direction by the distance of the half pitch $F_{GC}$ of the gate line electrode.

Similarly, the second resistance change device RW2 which is connected to the first active area AA1 and the second upper interconnect layer M22, and the fourth resistance change device RW4 which is connected to the second active area AA2 and the third upper interconnect layer M23 are preferably formed so as to be shifted in the column direction by the distance of the half pitch $F_{GC}$ of the gate electrode. In addition, the fourth resistance change device RW4 and the sixth resistance change device RW6 which is connected to the third active area AA3 and the fourth upper interconnect layer M24 are also preferably formed so as to be shifted in the column direction by the half pitch $F_{GC}$ of the gate line electrode.

Further, the second resistance change device RW2 which is connected to the second upper interconnect layer M22 and the third resistance change device RW3 are preferably present at approximately the same position in the row direction. In addition, similarly, the fourth resistance change device RW4 which is connected to the third upper interconnect layer M23 and the fifth resistance change device RW5 are also preferably formed at approximately the same position in the row direction.

The above-mentioned resistance change devices are formed so as to be shifted by $F_{GC}$ in the column direction, and are formed at approximately the same position in the row direction, thereby allowing the distance between the respective resistance change devices RW to be made more equal.

Meanwhile, the repeating region SS shown in FIG. 6 is merely illustrative, and any region can be selected in the repeating unit of the embodiment.

Next, data writing or readout operations to and from the memory cell of the embodiment will be described with reference to FIGS. 7A and 7B. Meanwhile, FIGS. 7A and 7B are enlarged views illustrating a portion of the planar layout of FIG. 3.

The word line WL which is connected to the gate electrode GC of the cell transistor CT included in a selection memory cell $MC_{SEL}$ is called a selection word line $WL_{SEL}$, and other word lines are called a non-selection word line $WL_{NON}$. In addition, the bit lines BL1 and BL2 which are connected to the selection memory cell are called selection bit lines $BL1_{SEL}$ and $BL2_{SEL}$, and other bit lines are called non-selection bit lines $BL1_{NON}$ and $BL2_{NON}$. As described above, BL1 corresponds to the upper interconnect layer M2, and BL2 corresponds to the lower interconnect layer M1. Meanwhile, the non-selection memory cell MC is called a non-selection memory cell $MC_{NON}$.

Writing operations will be described with reference to FIG. 7A. A potential difference is applied to the selection bit lines $BL1_{SEL}$ and $BL2_{SEL}$. For example, 0 V is applied to $BL1_{SEL}$, and a potential Vset is applied to $BL2_{SEL}$. 0 V is applied to the non-selection bit lines $BL1_{NON}$ and $BL2_{NON}$. In addition, a potential Von is applied to the selection word line $WL_{SEL}$, and the cell transistor CT is driven. A potential Voff is applied to the non-selection word line $WL_{NON}$, and the cell transistor CT and the dummy transistor DT are set to be in an off-state. The potential Voff is typically 0 V.

Figure 7A:
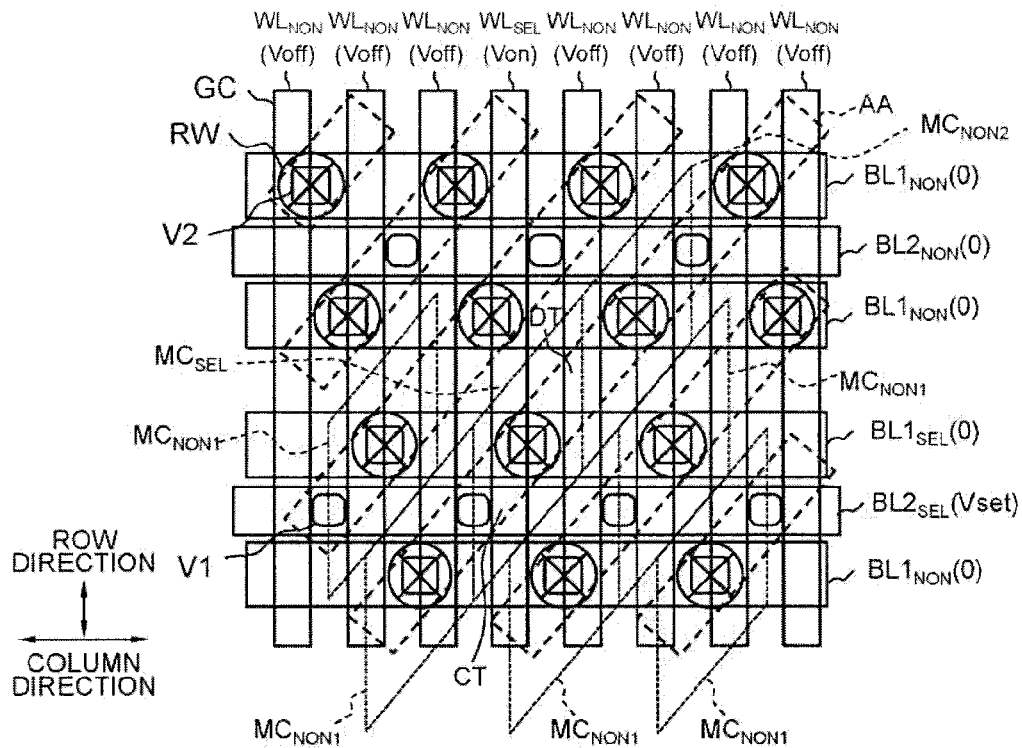
FIG. 7A is a diagram illustrating a writing operation of the resistance change type memory according to the first embodiment.
Figure 7B:
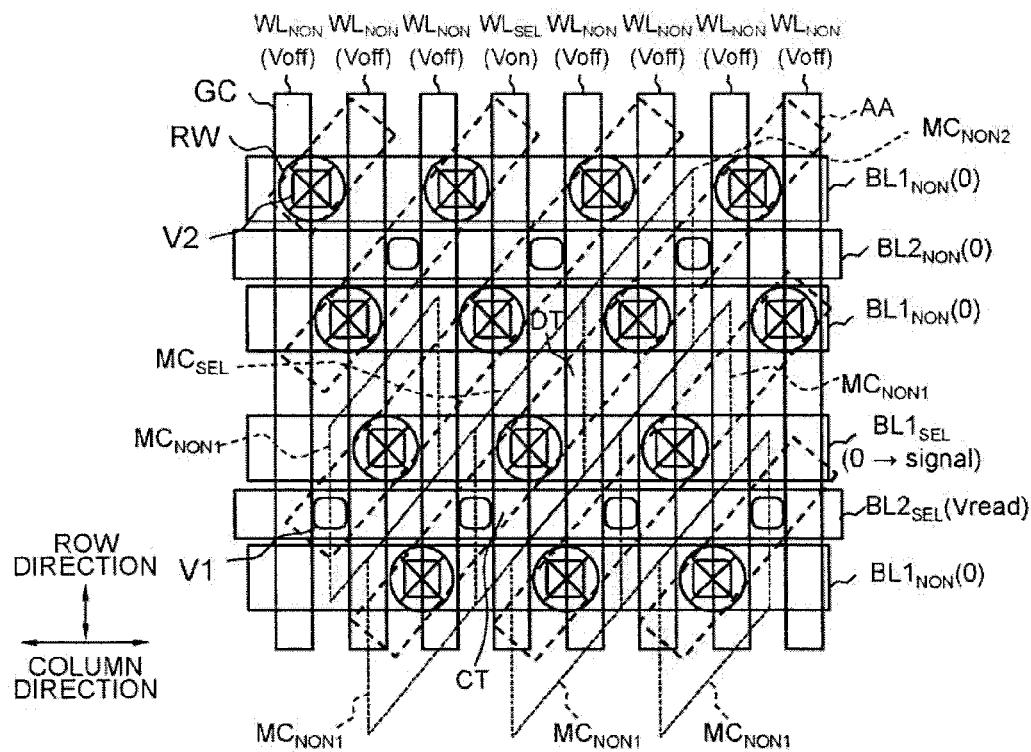
FIG. 7B is a diagram illustrating a readout operation of the resistance change type memory according to the first embodiment.

As shown in FIG. 7A, the potential Von is applied to the gate electrode GC of the cell transistor CT of the selection memory cell $MC_{SEL}$, and thus the cell transistor CT is driven. Therefore, a potential difference Vset between the selection bit lines $BL1_{SEL}$ and $BL2_{SEL}$ is applied to the resistance change device RW of the selection memory cell $MC_{SEL}$. The resistance change device RW is written by the application of a potential.

All the cell transistors CT of a non-selection memory cell $MC_{NON1}$ which is connected to the selection bit lines $BL1_{SEL}$ and $BL2_{SEL}$ are in an off-state. Therefore, a potential difference between selection bit lines $BL1_{SEL}$ and $BL2_{SEL}$ is not applied to the resistance change device RW which is connected to the non-selection memory cell $MC_{NON1}$, and writing is not performed.

In addition, the dummy transistor DT which is located at the boundary of a non-selection memory cell $MC_{NON2}$ next to the directions of the selection memory cell $MC_{SEL}$ and the active area AA is in an off-state. Therefore, a potential is not applied to the non-selection memory cell $MC_{NON2}$.

From the above, a description has been given in which little miswriting to the non-selection memory cell $MC_{NON}$ occurs, and writing to the selection memory cell $MC_{SEL}$ can be made.

Readout operations will be described with reference to FIG. 7B. A voltage which is applied to each bit line BL and each word line WL of the readout operations is basically the same as that in the writing operations. The difference in both operations is that a potential Vread for readout is applied to the selection bit line $BL2_{SEL}$, and that a current according to the electrical resistance of the resistance change device RW flows to the selection bit line $BL1_{SEL}$.

Meanwhile, in the readout of a signal, a current flowing to the selection bit line $BL1_{SEL}$ may be detected, and a drop in the potential of the selection bit line $BL2_{SEL}$ may be detected.

Meanwhile, during this writing or readout operation, it is preferable to apply 0 V or a negative potential to the gate electrode GC of the dummy transistor DT in order to prevent the malfunction of adjacent memory cells MC from occurring.

Hereinafter, a manufacturing method of the first embodiment will be described with reference to FIGS. 8A to 16B.

Meanwhile, in the following description of the manufacturing method, when only one drawing is present in the reference drawings without any special notice, it means that the drawing is equivalent to a cross-sectional view taken along line A-A' of FIG. 3. In addition, when two drawings of part A and part B are present in the reference drawings, it means that the drawings are equivalent to a cross-sectional view taken along line A-A' of FIG. 3 and a cross-sectional view taken along line B-B' of FIG. 3, respectively.

Figure 8A:
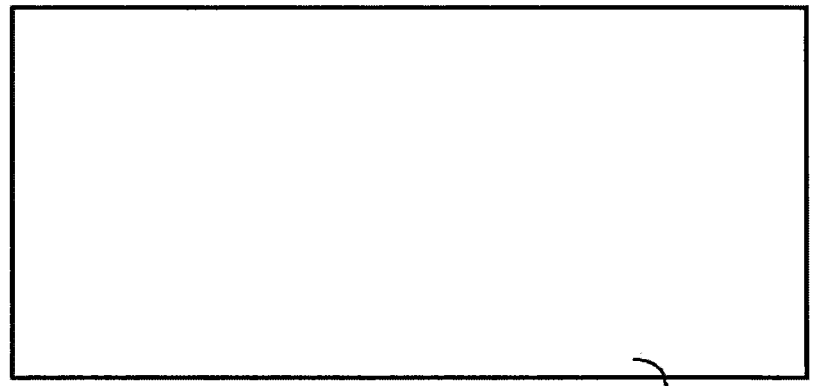
FIGS. 8A and 8B are schematic cross-sectional view showing manufacturing processes according to the first embodiment (part1)
Figure 8B:
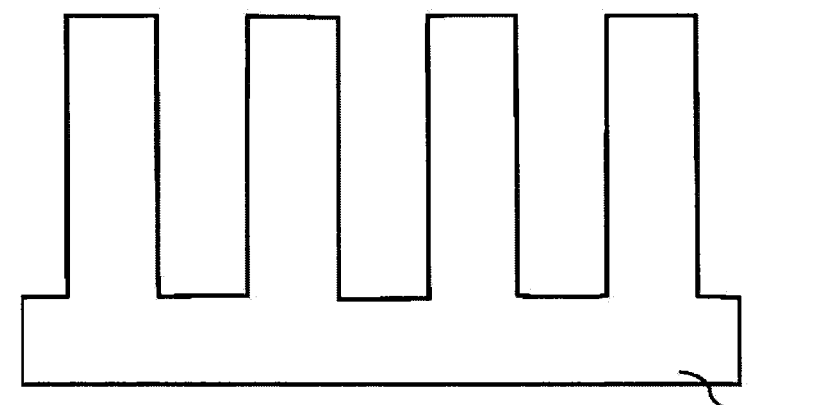

First, as shown in FIGS. 8A and 8B, a trench 155 for forming the device isolation region STI is formed on the semiconductor substrate 150 by etching.

Figure 9A:
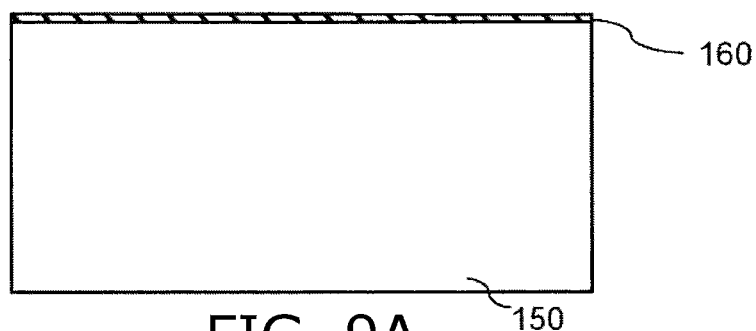
FIGS. 9A and 9B are schematic cross-sectional view showing manufacturing processes according to the first embodiment (part2)
Figure 9B:
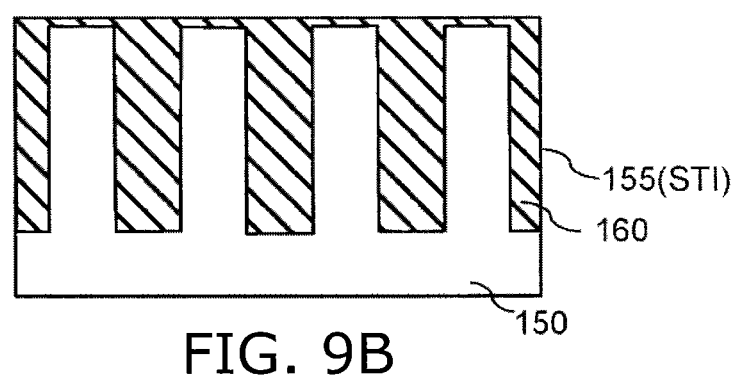

Next, as shown in FIGS. 9A and 9B, a device isolation insulating film 160 is buried in order to bury the trench 155. The device isolation insulating film 160 is planarized by a RIE (Reactive Ion Etching) method or a CMP (Chemical Mechanical Polishing) method. The device isolation region STI is formed by planarization. The device isolation insulating film 160 is, for example, a silicon oxide film. A region except for the device isolation region STI is called the active area AA.

Figure 10A:
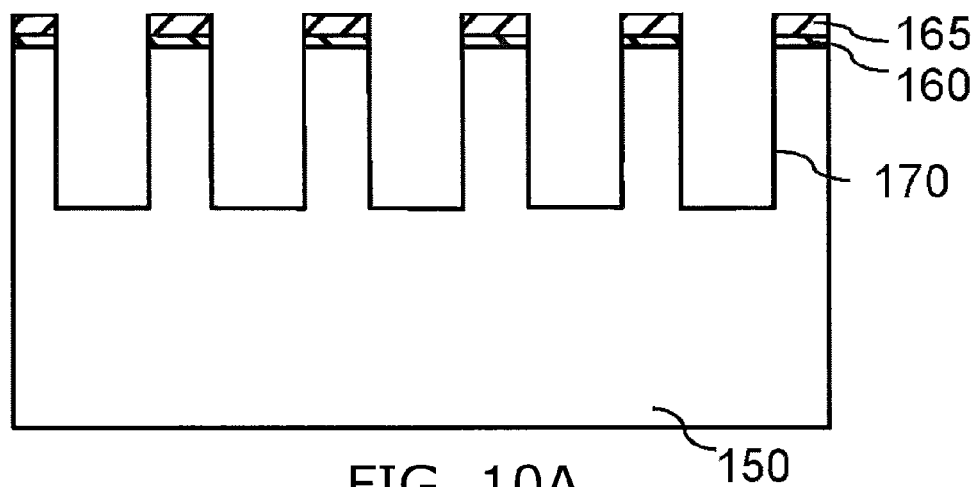
FIGS. 10A and 10B are schematic cross-sectional view showing manufacturing processes according to the first embodiment (part3)
Figure 10B:
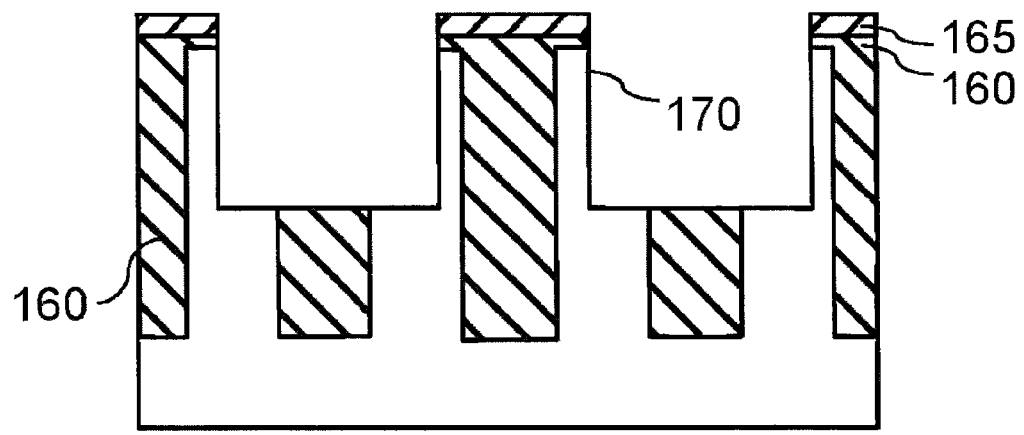

Subsequently, as shown in FIGS. 10A and 10B, a first interlayer dielectric film 165 is formed on the device isolation insulating film 160, and a trench 170 for forming the gate electrode GC is formed by an etching process.

Figure 11A:
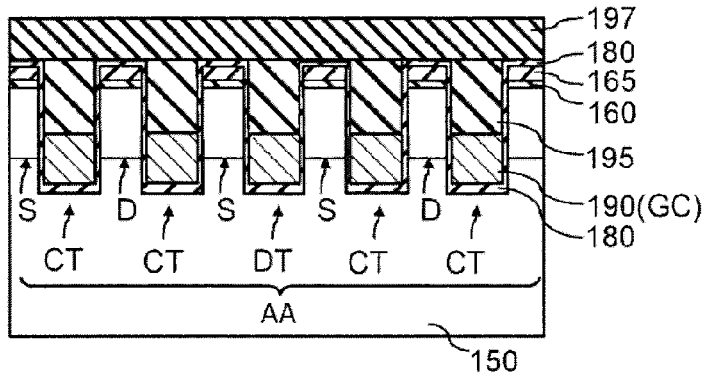
FIGS. 11A and 11B are schematic cross-sectional view showing manufacturing processes according to the first embodiment (part4)
Figure 11B:
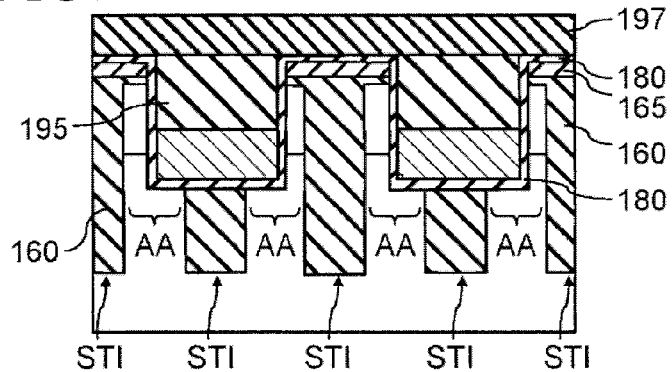

Subsequently, as shown in FIGS. 11A and 11B, a buried-type cell transistor CT is formed. After the trench 170 is formed, a gate insulating film 180 and a gate electrode layer 190 are formed and removed up to a predetermined height by etchback. Thereafter, a CMP stopper film 195 is formed, and planarization is performed. Next, an N+-type source region S and a drain region D are formed by, for example, the ion implantation of phosphorus, arsenic or the like. Thereafter, a second interlayer dielectric film 197 is formed.

The gate insulating film 180 is formed by a thermal oxidation method or the like, for example, using a silicon oxide film, a silicon nitride film, a silicon oxynitride film, or the like. In the gate electrode layer 190, for example, polycrystalline silicon, tungsten, copper, metal silicide, or the like is used. In the CMP stopper film 195, for example, a silicon nitride film is used. In the second interlayer dielectric film 197, for example, a silicon oxide film is used.

Figure 12:
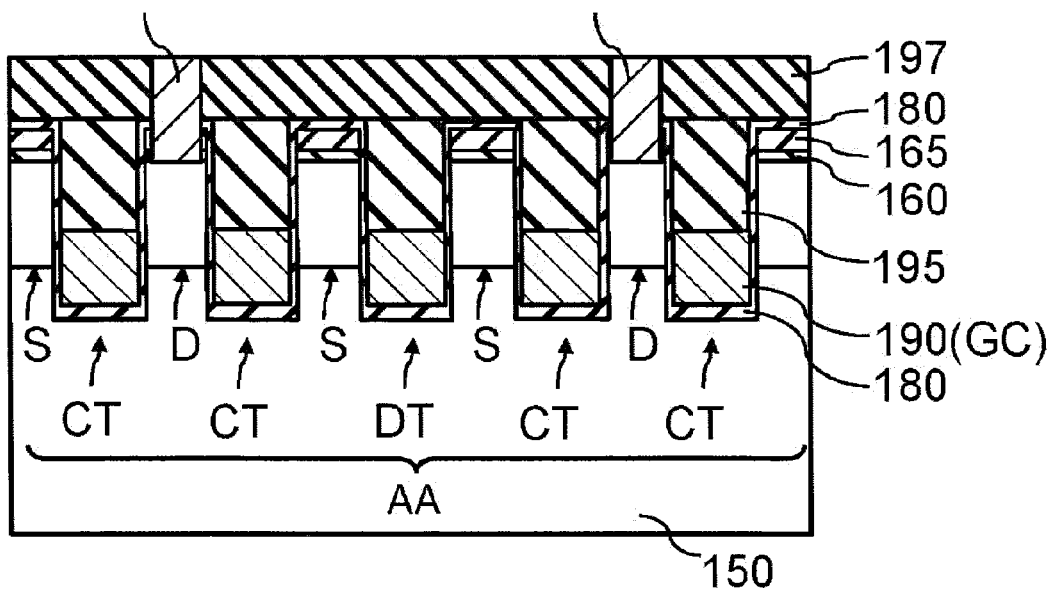
FIG. 12 is a schematic cross-sectional view showing manufacturing processes according to the first embodiment (part5)

Subsequently, as shown in FIG. 12, the lower interconnect layer contact V1 is formed. First, a desired mask pattern is formed on the second interlayer dielectric film 197 by a lithography method. A lower interconnect layer contact hole reaching the drain region D is formed using the mask pattern as a mask. A lower interconnect layer contact material 200 is formed, and the extra lower interconnect layer contact material 200 is removed by a CMP method. Thereby, the lower interconnect layer contact V1 is formed. This state is shown in FIG. 12.

In the lower interconnect layer contact material 200, for example, a conductive material such as titanium, titanium nitride, or tungsten is used.

Figure 13A:
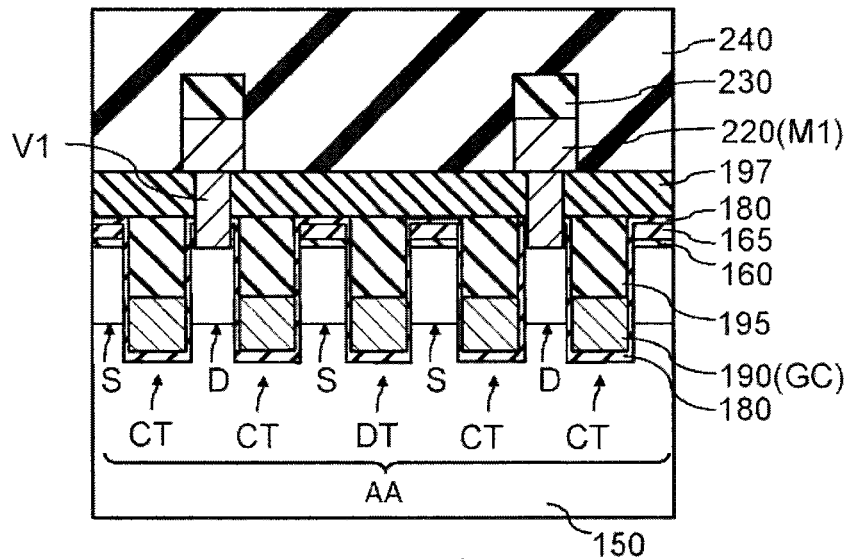
FIGS. 13A and 13B are schematic cross-sectional view showing manufacturing processes according to the first embodiment (part6)
Figure 13B:
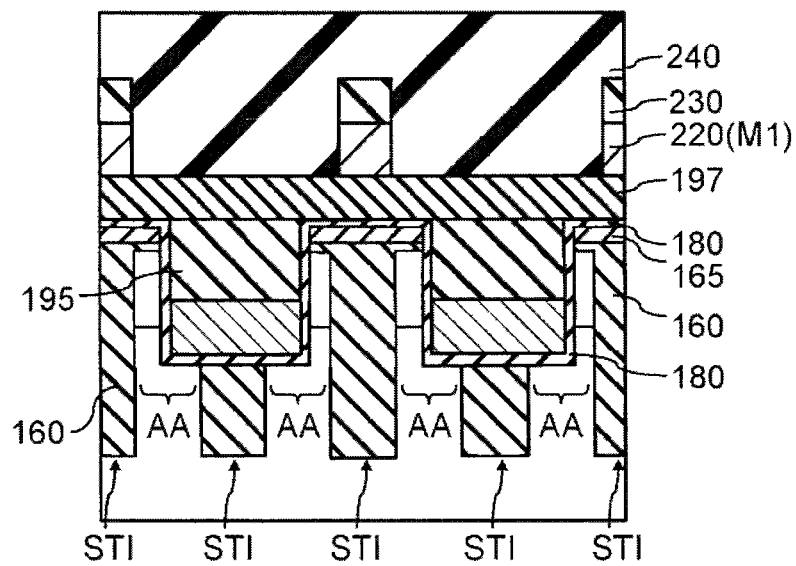

Subsequently, as shown in FIGS. 13A and 13B, the lower interconnect layer M1 is formed. First, a lower interconnect layer material 220 and a hard mask 230 are formed. A desired mask pattern is formed on the hard mask 230 by a lithography method. Using the mask pattern as a mask, the hard mask 230 and the lower interconnect layer material 220 are etched by a RIE method. Thereafter, a third interlayer dielectric film 240 is formed, and is planarized by a CMP method, as necessary.

The lower interconnect layer material 220 includes, for example, a barrier metal layer and a metal layer. In the barrier metal layer, for example, titanium, tantalum, niobium, titanium nitride, tantalum nitride, niobium nitride, or a stacked body is used. In the metal layer, tungsten, copper, aluminum, or the like is used. In the hard mask 230, for example, silicon oxide film, silicon nitride film, polycrystalline silicon, carbon, or a stacked body is used. In the third interlayer dielectric film 240, for example, a silicon oxide film is used.

Figure 14A:
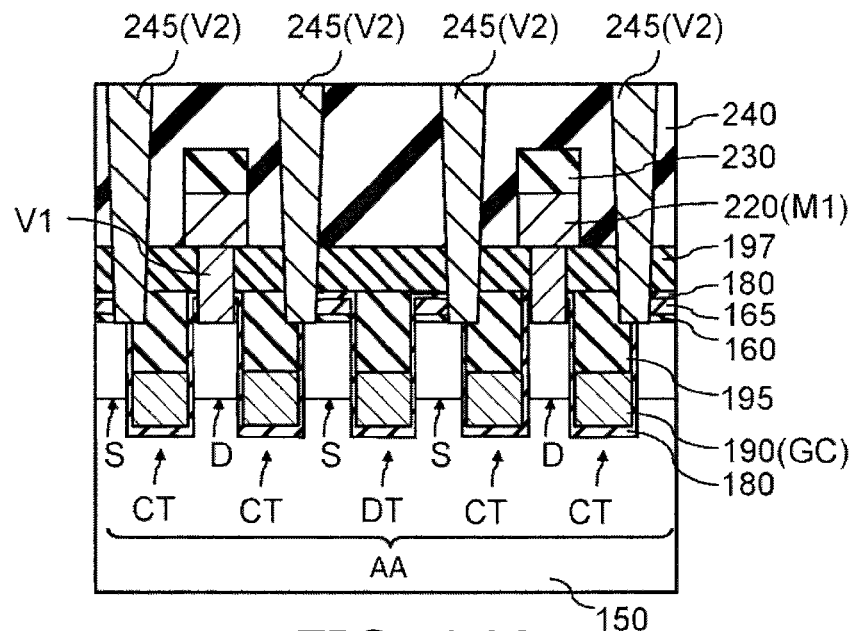
FIGS. 14A and 14B are schematic cross-sectional view showing manufacturing processes according to the first embodiment (part7)
Figure 14B:
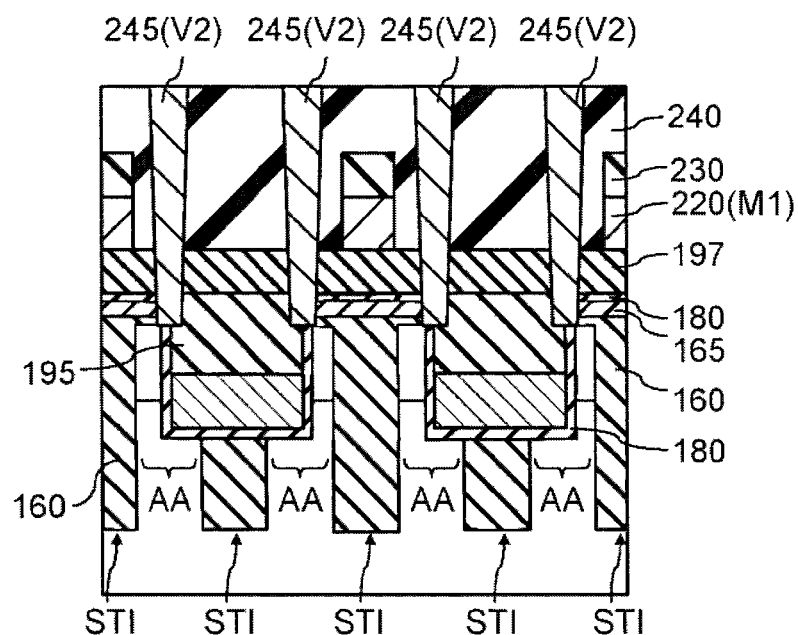

Subsequently, as shown in FIGS. 14A and 14B, the upper interconnect layer contact V2 is formed. First, a desired mask pattern is formed on the third interlayer dielectric film 240 by a lithography method. Using the mask pattern as a mask, an upper interconnect layer contact hole is processed by a RIE method in order to reach the source region S. Thereafter, an upper interconnect layer contact material 245 is formed, and the extra upper interconnect layer contact material 245 is removed by a CMP method. Thereby, the upper interconnect layer contact V2 is formed.

In the upper interconnect layer contact material 245, titanium, titanium nitride, tungsten, or the like is used.

Figure 15A:
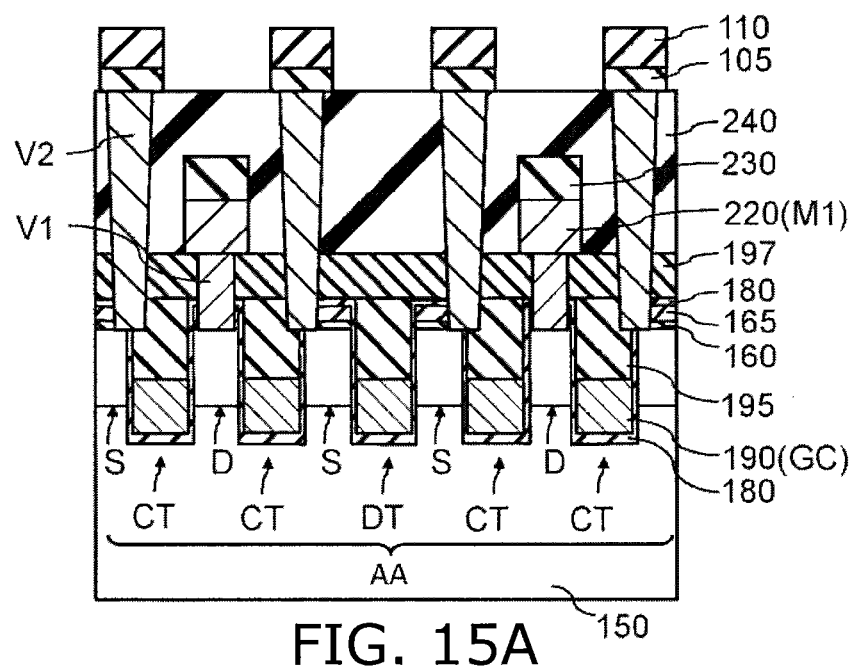
FIGS. 15A and 15B are schematic cross-sectional view showing manufacturing processes according to the first embodiment (part8)
Figure 15B:
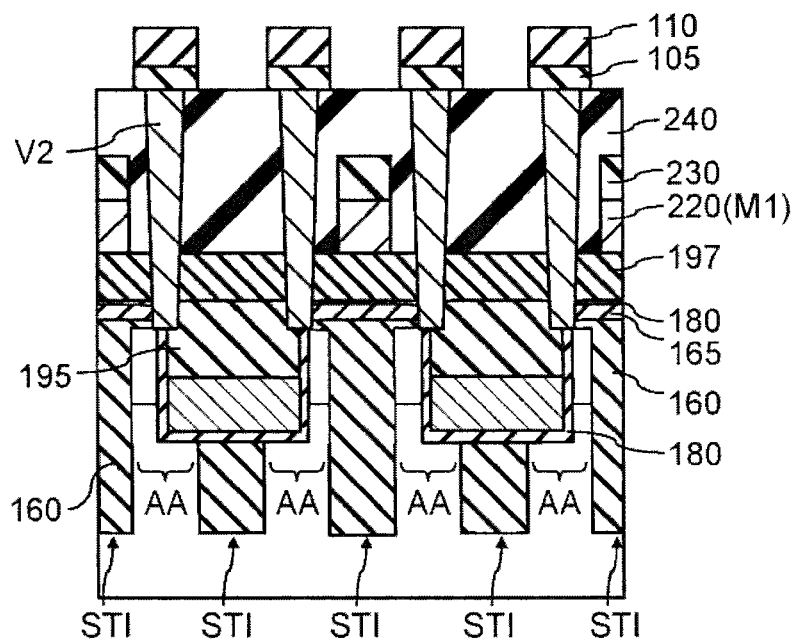

Subsequently, as shown in FIGS. 15A and 15B, the resistance change device RW is formed, and a fourth interlayer dielectric film 250 is formed. First, the orientation layer 105 and the superlattice layer 110 are formed. The resistance change device RW may include an electrode layer in addition to the orientation layer 105 and the superlattice layer 110. Thereafter, a desired mask pattern is formed on the superlattice layer 110 by a lithography method. Using the mask pattern as a mask, the superlattice layer 110 and the orientation layer 105 are etched by a RIE method. The resistance change device RW is formed by this etching process. Thereafter, the fourth interlayer dielectric film 250 is formed, and is planarized by a CMP method as necessary.

In the orientation layer 105, for example, a chalcogen compound containing antimony and tellurium as a major component or a chalcogen compound containing bismuth and tellurium as a major component is used.

The superlattice layer 110 has the first crystal layer and the second crystal layer stacked alternately repeatedly. In the first crystal layer, for example, a chalcogen compound containing germanium and tellurium as a major component is used. In the second crystal layer, for example, a chalcogen compound containing antimony as a major component, a chalcogen compound containing bismuth and tellurium as a major component, or the like is used. When an electrode layer is formed, a metal layer such as tungsten is used as the electrode layer.

In the fourth interlayer dielectric film 250, for example, a silicon oxide film is used.

Figure 16A:
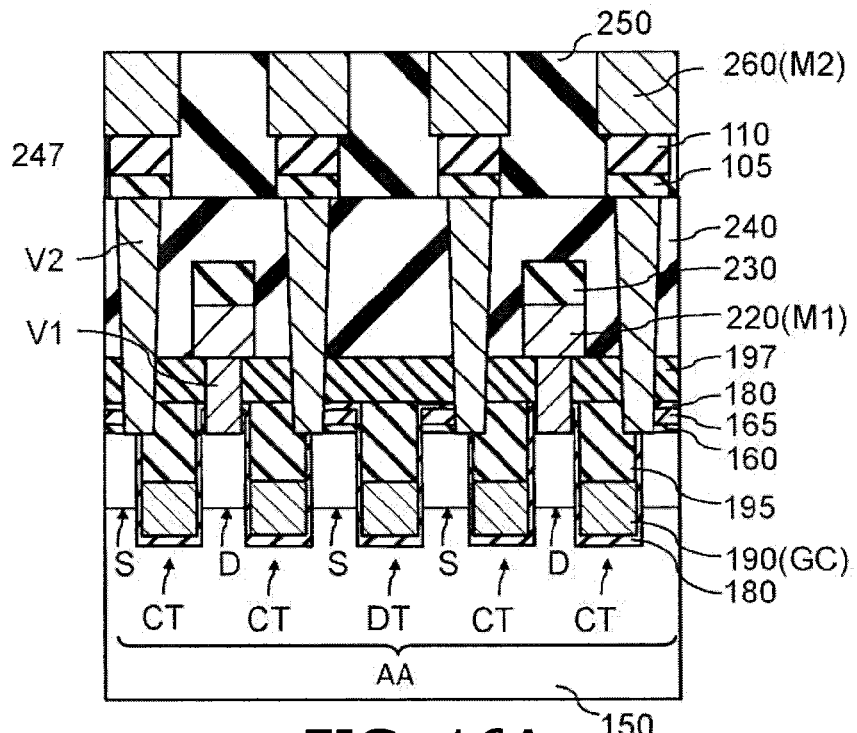
FIGS. 16A and 16B are schematic cross-sectional view showing manufacturing processes according to the first embodiment (part9)
Figure 16B:
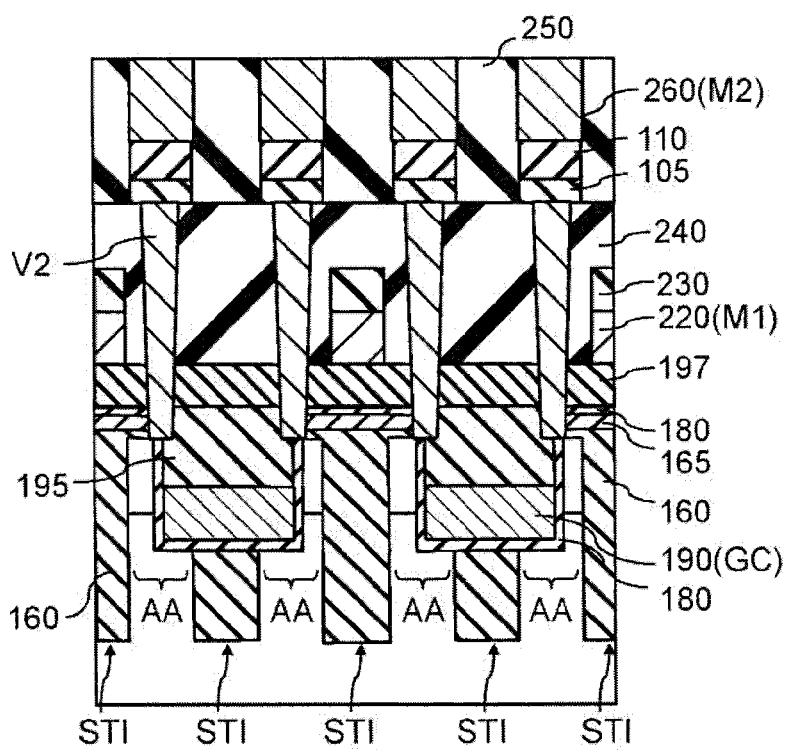

Subsequently, as shown in FIGS. 16A and 16B, the upper interconnect layer M2 is formed. A desired mask pattern is formed on the fourth interlayer dielectric film 250 by a lithography method. Using this mask pattern as a mask material, the fourth interlayer dielectric film 250 is etched by a RIE method in order to reach the resistance change device RW. An upper-layer interconnect trench is formed by the etching process. An upper interconnect layer material 260 is formed in this upper-layer interconnect trench, and the upper interconnect layer material 260 which is a portion except for the upper-layer interconnect trench is removed by a CMP method.

In the upper interconnect layer material 260, for example, a barrier metal layer and a metal layer are used. In the barrier metal layer, for example, titanium, tantalum, niobium, titanium nitride, tantalum nitride, niobium nitride, or a stacked body is used. In the metal layer, tungsten, copper, aluminum, or the like is used. As a specific example of the embodiment, a stacked body of titanium and titanium nitride is used in the barrier metal, and tungsten is used in the metal layer.

Subsequently, various types of interconnect layers and circuit devices are formed using a general manufacturing method. In this manner, the resistance change type memory of the embodiment is manufactured.

According to the embodiment described above, the active area AA can be formed in a line shape without being divided. That is, the active area AA, corresponding to several memory cells, is not required to be divided in an island shape.

In order to prevent the malfunction of the adjacent memory cells MC with respect to the active area AA, a case is also considered in which the active area AA is divided in an island shape with respect to several memory cells. In order to form a fine island-shaped pattern, a case is also considered in which processing in a line shape is performed, and then another processing of dividing the line is performed. In such a case, even when formation by single processing is attempted, it is difficult to form a mask pattern, or to form a desired pattern in a subsequent etching process.

In the embodiment, the active area AA may be preferably formed in a line shape, and thus processing of dividing the line of one active area can be omitted. This processing of dividing the line can be omitted, and thus it is possible to reduce the numbers of lithography processes, etching processes, and the like. A reduction in the number of processes leads to a reduction in material cost or manufacturing indirect cost. In addition, it is possible to achieve an improvement in yield rate or a reduction in cost, and to supply a low-cost memory.

Each gate electrode GC is provided at a predetermined interval and in a line shape. The gate electrode GC is provided at a predetermined interval and in a line shape, and thus the formation of a mask pattern and the etching process are facilitated.

The easy manufacturing thereof leads to an improvement in yield rate, and thus a low-cost memory can be further supplied.

Further, as shown in FIG. 3 and FIGS. 4A and 4B, in regions in which the memory cell MC is formed periodically, other elements such as a contact are not present at the same height as that of the resistance change device RW. Since other elements are not present, it is possible to increase the size of the resistance change device RW, and to provide a higher-reliability memory.

In addition, as shown in FIG. 5 and FIG. 6, components are provided so that the distance between the resistance change devices RW is close to uniformity. This can facilitate the formation of a mask pattern and an etching process, in the process of the resistance change device RW. In addition, variation can also be reduced for each resistance change device RW. This is a very important effect in a memory device requiring reliability and the uniformity of characteristics. The dummy transistor DT is also said to device isolation transistor.

Subsequently, a variation of the first embodiment will be described.

A description has been given in which the source region S of the cell transistor CT is provided on both sides of the gate electrode GC of the dummy transistor DT, but the drain region D may be provided. That is, in the above-mentioned description, the drain region D and the source region S may be replaced with each other.

The orientation layer 105 and the superlattice layer 110 may be turned upside down.

Second Embodiment

Figure 17:
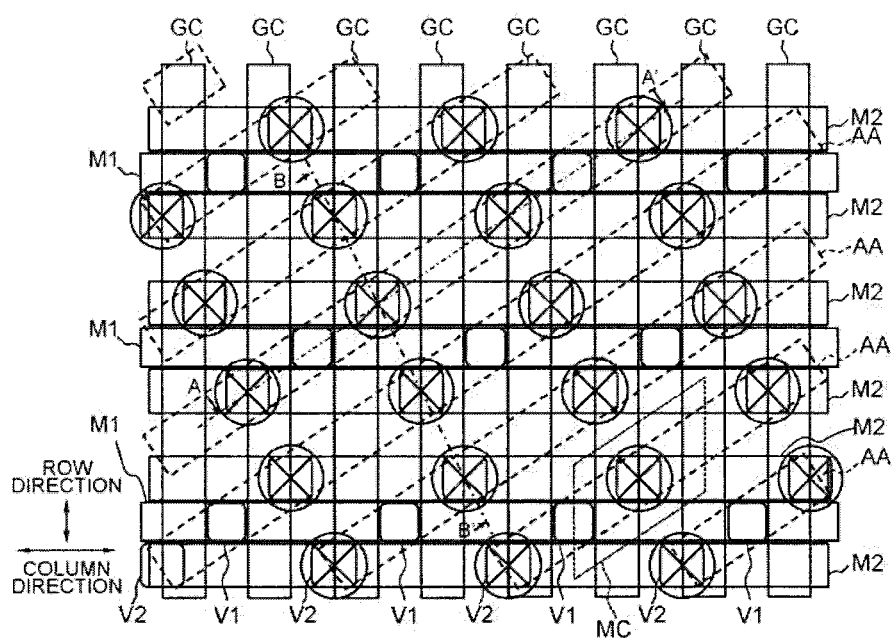
FIG. 17 is a schematic planar layout diagram according to a variation of a second embodiment.
Figure 18A:
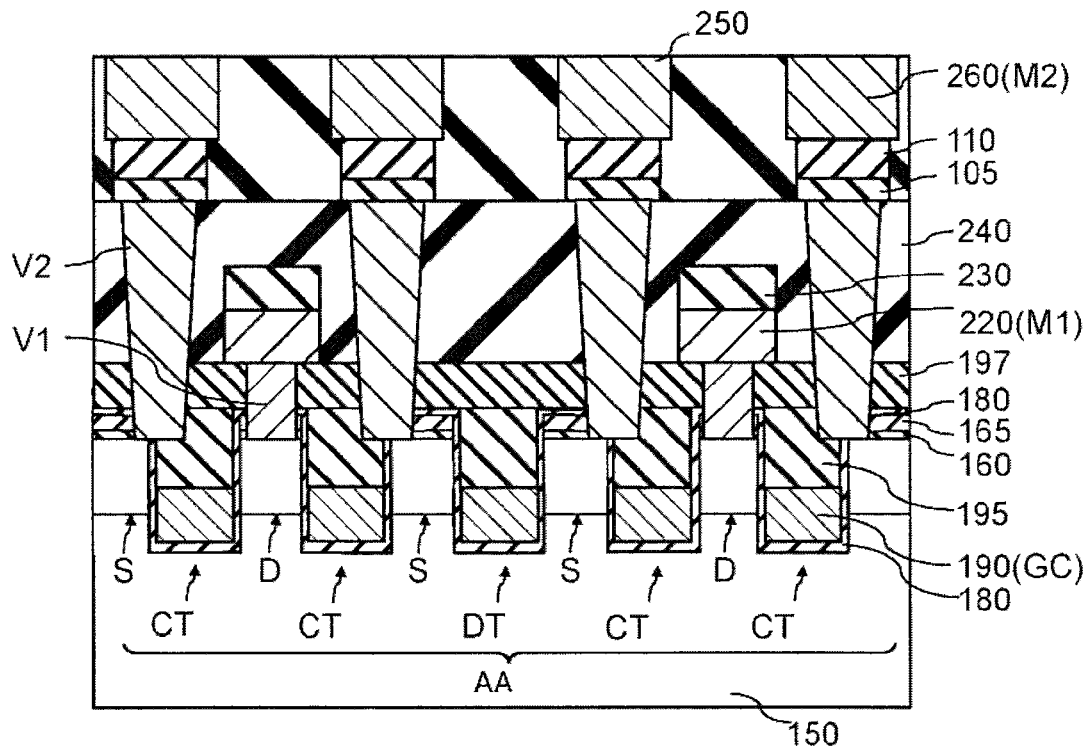
FIG. 18A is a schematic cross-sectional view taken along line A-A' of FIG. 17.
Figure 18B:
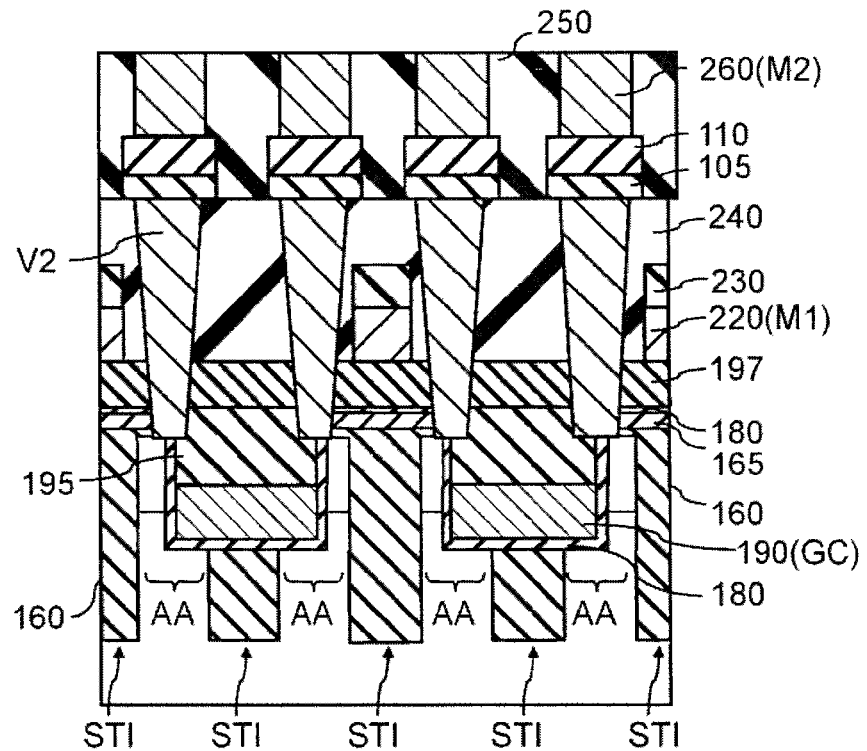
FIG. 18B is a schematic cross-sectional view taken along line B-B' of FIG. 17.

FIG. 17 shows a planar layout according to a second embodiment. FIG. 18A is a cross-sectional view taken along line A-A' of FIG. 17A. FIG. 18B is a cross-sectional view taken along line B-B' of FIG. 17A.

The embodiment is different from the first embodiment, in that the relation of $F_{M2}=F_{GC}$ is established. In this case, the angle between the active area and the gate electrode is approximately 56 degrees. The relation of connection in FIGS. 18A and 18B, and the like are the same as those in the first embodiment. In this case, similarly, the active area AA may be formed in a line shape, and may not be formed in an island shape.

However, a difference in the distance between the resistance change devices RW becomes larger than in the first embodiment.

Third Embodiment

Figure 19:
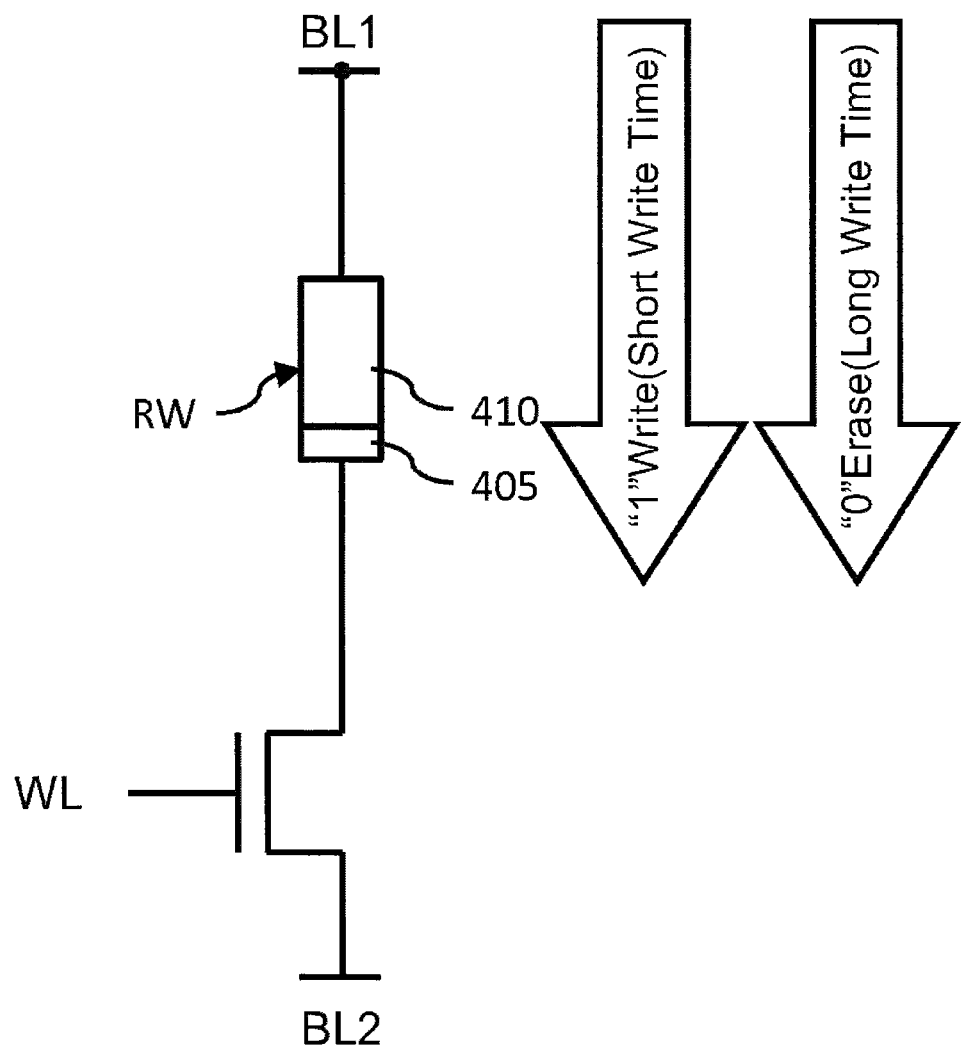
FIG. 19 is a diagram illustrating an operation of the memory cell MC in a third embodiment.

FIG. 19 shows a configuration of a resistance change device RW of a memory device according to a third embodiment of the invention. Unlike the first embodiment, in this memory device, a phase change memory device is used as the resistance change device RW.

The phase change memory device includes a phase change layer 410 and a lower electrode layer 405. In addition, an upper electrode layer may be included therein. In the phase change layer 410, for example, GST or the like having germanium, antimony, and tellurium is used. The GST causes a current to flow and generates Joule heat, thereby allowing a structure to be changed between an amorphous state and a crystal state. For example, the GST is set to a high resistance state in the amorphous state, and is set to a low resistance state in the crystal state.

Therefore, when the low resistance state is defined as data "0", and the high resistance state is defined as "1", data can be stored similarly to the superlattice change-type phase change memory device described earlier.

Meanwhile, the lower electrode layer 405 can be used in heating the phase change layer 410 as a Joule heat source. A specific material includes titanium nitride, and film formation is performed by a sputtering method or a CVD method.

As an example of the embodiment, the lower electrode layer 405 and the phase change layer 410 described above are used instead of the orientation layer 105 and the superlattice layer 110 shown in FIGS. 4A and 4B or FIGS. 18A and 18B.

Thereby, the phase change memory device can be used as the resistance change device RW.

Meanwhile, the lower electrode layer 405 may be formed within the upper interconnect layer contact V2. When the layer is formed within the upper interconnect layer contact V2, the contact portion between the lower electrode layer 405 and the phase change layer 410 is small. Therefore, since the heating portion of the phase change layer 410 is small, it is possible to reduce a writing current or voltage, and an erasing current or voltage, and to obtain a memory device which is driven by a low voltage and a constant current.

Fourth Embodiment

Figure 20:
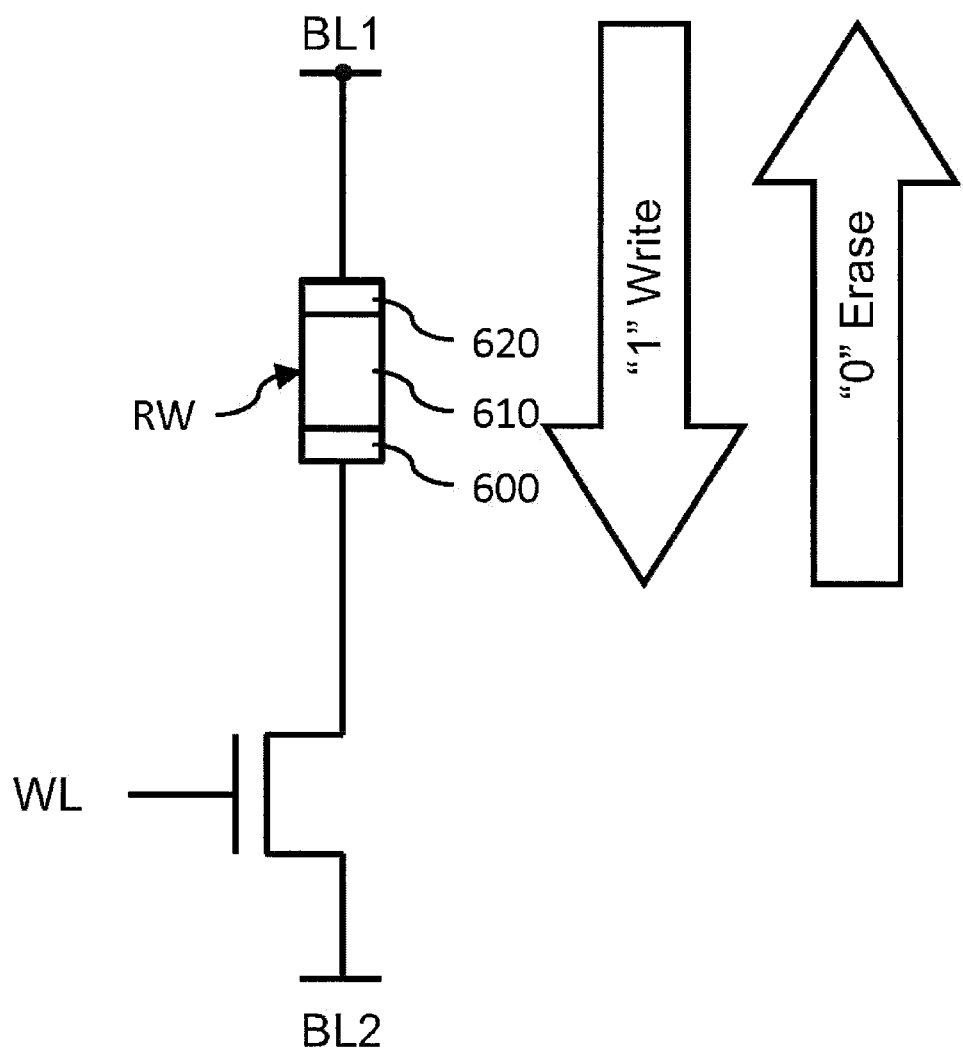
FIG. 20 is a diagram illustrating an operation of the memory cell MC in a fourth embodiment.

FIG. 20 shows a configuration of a resistance change device RW of a memory device according to a fourth embodiment of the invention. Unlike the first embodiment, an ion memory device is used as the resistance change device RW.

The ion memory device may include an ion source electrode layer 600, an ion diffusion layer 610, and an opposite electrode layer 620.

The opposite electrode layer 620 may be preferably a conductive material, and polycrystalline silicon or a metal material, for example, is used in the layer. When the metal material is used, a metal element which is not likely to be diffused is preferably used in the ion diffusion layer 610.

As a typical example, when silicon is used in the ion diffusion layer 610, for example, titanium nitride, molybdenum, tantalum, or the like is used in the opposite electrode layer 620.

The ion diffusion layer 610 is configured such that a metal of a second electrode can be ionized and diffused, and may preferably have high resistance. For example, a material used in the layer is amorphous silicon, silicon oxide, silicon nitride, transition metal oxide, or the like to which an n-type impurity or a p-type impurity is not intentionally added.

An element which does not react with silicon is preferably used in the ion source electrode layer 600, and, for example, silver, copper, aluminum, cobalt, nickel, titanium, or the like is used.

The ion memory device transitions to the low resistance state and the high resistance state using the following method.

When a forward voltage is applied between the ion source electrode layer 600 and the opposite electrode layer 620, metal atoms (metal ions) are conducted from the ion source electrode layer 600 to the ion diffusion layer 610. Thereby, a filament is formed in the ion diffusion layer. This filament becomes a conduction path between the ion source electrode layer 600 and the opposite electrode layer 620, and the ion diffusion layer 610 has a reduction in resistance.

On the other hand, when a relatively high voltage having a reverse direction is applied between the ion source electrode layer 600 and the opposite electrode layer 620, metal ions in the filament are reversely conducted to the ion source electrode, and thus the conduction path caused by the filament is interrupted. Thereby, the ion diffusion layer 610 is set to be in a high resistance state.

Therefore, when the low resistance state is defined as data "0", and the high resistance state is defined as "1", data can be stored similarly to the superlattice change-type phase change memory device described earlier.

As an example of the embodiment, the ion source electrode layer 600, the ion diffusion layer 610, and the opposite electrode layer 620 are used instead of the orientation layer 105 and the superlattice layer 110 shown in FIGS. 4A and 4B or FIGS. 18A and 18B.

In addition, as a variation, the ion source electrode layer 600 may be formed within the upper interconnect layer contact V2, and the opposite electrode layer 620 may be formed as the lower layer of the upper interconnect layer M2.

While certain embodiments have been described, these embodiments have been presented by way of example only, and are not intended to limit the scope of the invention. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A memory device comprising:
a substrate;
a first gate electrode and a second gate electrode, formed on the substrate, which extend in a second direction intersecting a first direction;
a third gate electrode that extends in the second direction on an opposite side to the first gate electrode with respect to the second gate electrode;
a fourth gate electrode that extends in the second direction on an opposite side to the second gate electrode with respect to the third gate electrode;
a fifth gate electrode that extends in the second direction on an opposite side to the third gate electrode with respect to the fourth gate electrode;
a first active area that extends in a third direction intersecting the first direction and the second direction;
a second active area, electrically insulated from the first active area, which extends in the third direction;
a third active area, electrically insulated from the second active area, which extends in the third direction;
a first contact which is provided on the first active area and between the first gate electrode and the second gate electrode;
a second contact which is provided on the first active area and between the second gate electrode and the third gate electrode;
a third contact which is provided on the first active area and between the third gate electrode and the fourth gate electrode;
a fourth contact which is provided on the second active area and between the first gate electrode and the second gate electrode;
a fifth contact which is provided on the second active area and between the second gate electrode and the third gate electrode;
a sixth contact which is provided on the second active area and between the third gate electrode and the fourth gate electrode;
a seventh contact which is provided on the third active area and between the first gate electrode and the second gate electrode;
an eighth contact which is provided on the third active area and between the second gate electrode and the third gate electrode;
a ninth contact which is provided on the third active area and between the third gate electrode and the fourth gate electrode;
a tenth contact which is provided on the third active area and between the fourth gate electrode and the fifth gate electrode;
a first interconnect layer which is provided above the first gate electrode so as to be connected to the first contact;
a second interconnect layer which is provided above the first gate electrode so as to be connected to the fifth contact;
a third interconnect layer which is provided above the first gate electrode so as to be connected to the ninth contact;
a first resistance change device which is provided above the second contact;
a second resistance change device which is provided above the third contact;
a third resistance change device which is provided above the fourth contact;
a fourth resistance change device which is provided above the sixth contact;

a fifth resistance change device which is provided above the seventh contact;
a sixth resistance change device which is provided above the eighth contact;
a seventh resistance change device which is provided above the tenth contact;
a fourth interconnect layer which is provided so as to be connected to an upper side portion of the first resistance change device;
a fifth interconnect layer which is provided so as to be connected to an upper side portion of the second resistance change device and an upper side portion of the third resistance change device;
a sixth interconnect layer which is provided so as to be connected to an upper side portion of the fourth resistance change device and an upper side portion of the fifth resistance change device;
a seventh interconnect layer which is provided so as to be connected to an upper side portion of the sixth resistance change device; and
an eighth interconnect layer which is provided so as to be connected to an upper side portion of the seventh resistance change device.

2. The device according to claim 1, wherein the fourth interconnect layer, the fifth interconnect layer, the sixth interconnect layer, the seventh interconnect layer, and the eighth interconnect layer are located above the first interconnect layer, the second interconnect layer, and the third interconnect layer, and
the first interconnect layer, the second interconnect layer, the third interconnect layer, the fourth interconnect layer, the fifth interconnect layer, the sixth interconnect layer, the seventh interconnect layer, and the eighth interconnect layer extend in the first direction.

3. The device according to claim 1, wherein half a length of a sum of a width of the fourth interconnect layer in the second direction and a width of an interval between the fourth interconnect layer and the fifth interconnect layer is appropriately 1.77 times half the length of a sum of a width of the first gate electrode in the first direction and a width of an interval between the first gate electrode and the second gate electrode in the first direction.

4. A memory device comprising:
a substrate;
a first gate electrode and a second gate electrode, formed on the substrate, which extend in a second direction intersecting a first direction;
a third gate electrode which is adjacent to an opposite side to the first gate electrode with respect to the second gate electrode and extends in the second direction;
a fourth gate electrode which is adjacent to an opposite side to the second gate electrode with respect to the third gate electrode and extends in the second direction;
a fifth gate electrode which is adjacent to an opposite side to the third gate electrode with respect to the fourth gate electrode and extends in the second direction;
an active area that extends in a third direction intersecting the first direction and the second direction;
a first lower interconnect layer contact which is provided on the active area and between the first gate electrode and the second gate electrode;
a first upper interconnect layer contact which is provided on the active area and between the second gate electrode and the third gate electrode;
a second upper interconnect layer contact which is provided on the active area and between the third gate electrode and the fourth gate electrode;
a second lower interconnect layer contact which is provided on the active area and between the fourth gate electrode and the fifth gate electrode;
a first interconnect layer, extending in the first direction, which is provided above the substrate so as to be connected to the first lower interconnect layer contact;
a second interconnect layer, extending in the first direction, which is provided above the substrate so as to be connected to the second lower interconnect layer contact;
a first resistance change device which is provided above the first upper interconnect layer contact;
a second resistance change device which is provided above the second upper interconnect layer contact;
a third interconnect layer, extending in the first direction, which is provided so as to be electrically connected to an upper side portion of the first resistance change device;
a fourth interconnect layer, extending in the first direction, which is provided so as to be electrically connected to an upper side portion of the second resistance change device;
a first transistor which is provided at an intersection point between the active area and the first gate electrode;
a second transistor which is provided at an intersection point between the active area and the second gate electrode;
a third transistor which is provided at an intersection point between the active area and the third gate electrode;
a fourth transistor which is provided at an intersection point between the active area and the fourth gate electrode;
a fifth transistor which is provided at an intersection point between the active area and the fifth gate electrode; and
the third transistor is a device isolation transistor.

5. The device according to claim 4, wherein the third interconnect layer and the fourth interconnect layer are provided above the first interconnect layer and the second interconnect layer, and
the third gate electrode is in an off-state during readout or writing of the first resistance change device and the second resistance change device.

6. The device according to claim 4, wherein a length of a sum of a width of the third interconnect layer in the second direction and a width of an interval between the third interconnect layer and the fourth interconnect layer is appropriately 1.77 times a length of a sum of a width of the first gate electrode in the first direction and a width of an interval between the first gate electrode and the second gate electrode in the first direction.

7. The device according to claim 1, wherein the first resistance change device, the second resistance change device, the third resistance change device, the fourth resistance change device, the fifth resistance change device, the sixth resistance change device, and the seventh resistance change device are superlattice-type phase change memory devices having a superlattice layer which are composed of a first crystal layer and a second crystal layer, and an orientation layer.

8. The device according to claim 1, wherein half a length of a sum of a width of the fourth interconnect layer in the second direction and a width of an interval between the fourth interconnect layer and the fifth interconnect layer is 1.93 times or 1.32 times half a length of a sum of a width of the first gate electrode in the first direction and a width of an interval between the first gate electrode and the second gate electrode in the first direction.

9. The device according to claim 1, wherein a distance between a central axis of the first resistance change device in the first direction and a central axis of the third resistance change device is half a length of a sum of a distance between the first gate electrode and the second gate electrode in the first direction and a width of the second gate electrode, and a distance between a central axis of the third resistance change device in the first direction and a central axis of the fifth resistance change device is half a length of a sum of a distance between the first gate electrode and the second gate electrode in the first direction and a width of the first gate electrode.

10. The device according to claim 1, wherein the third resistance change device is provided in the first direction when viewed from the second resistance change device.

11. The device according to claim 1, wherein a first potential difference is applied between the second gate electrode and the first gate electrode,
    a second potential difference is applied between the first interconnect layer and the forth interconnect layer, and
    a readout operation of the first resistance change device is performed by detecting a current flowing to the first interconnect layer or the forth interconnect layer, or detecting a drop in the second potential difference.

12. The device according to claim 1, wherein the first gate electrode, the second gate electrode, the third gate electrode, the fourth gate electrode, the fifth gate electrode, the first interconnect layer, the second interconnect layer, the third interconnect layer, the fourth interconnect layer, the fifth interconnect layer, the sixth interconnect layer, the seventh interconnect layer, and the eighth interconnect layer are provided
    further upward than a surface including an upper surface of the first resistance change device, an upper surface of the second resistance change device, an upper surface of the third resistance change device, an upper surface of the fourth resistance change device, an upper surface of the fifth resistance change device, an upper surface of the sixth resistance change device, and an upper surface of the seventh resistance change device, or
    further downward than a surface including a lower surface of the first resistance change device, a lower surface of the second resistance change device, a lower surface of the third resistance change device, a lower surface of the fourth resistance change device, a lower surface of the fifth resistance change device, a lower surface of the sixth resistance change device, and a lower surface of the seventh resistance change device.

13. The device according to claim 1, wherein half a length of a sum of a width of the fourth interconnect layer in the second direction and a width of an interval between the fourth interconnect layer and the fifth interconnect layer is the same as half a length of a sum of a width of the first gate electrode in the first direction and a width of an interval between the first gate electrode and the second gate electrode in the first direction.

14. The device according to claim 5, wherein a first potential difference is applied between the second gate electrode and the first gate electrode,
    a second potential difference is applied between the first interconnect layer and the third interconnect layer, and
    a readout operation of the first resistance change device is performed by detecting a current flowing to the first interconnect layer or the third interconnect layer, or detecting a drop in the second potential difference.

* * * * *